(12) United States Patent
Innocent

(10) Patent No.: US 10,741,592 B2
(45) Date of Patent: Aug. 11, 2020

(54) IMAGE SENSORS WITH MULTI-PHOTODIODE IMAGE PIXELS AND VERTICAL TRANSFER GATES

(71) Applicant: SEMICONDUCTOR COMPONENTS INDUSTRIES, LLC, Phoenix, AZ (US)

(72) Inventor: Manuel H. Innocent, Wezemaal (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/002,908

(22) Filed: Jun. 7, 2018

(65) Prior Publication Data
US 2019/0378864 A1 Dec. 12, 2019

(51) Int. Cl.
| H01L 27/146 | (2006.01) |
|---|---|
| H04N 5/374 | (2011.01) |
| H04N 5/378 | (2011.01) |
| H04N 5/369 | (2011.01) |

(Continued)

(52) U.S. Cl.
CPC .... *H01L 27/14605* (2013.01); *H01L 27/1463* (2013.01); *H01L 27/14607* (2013.01); *H01L 27/14614* (2013.01); *H04N 5/359* (2013.01); *H04N 5/3696* (2013.01); *H04N 5/374* (2013.01); *H04N 5/378* (2013.01); *H04N 9/045* (2013.01)

(58) Field of Classification Search
CPC ......... H01L 27/14605; H01L 27/14607; H01L 27/14614; H01L 27/1463; H04N 5/359; H04N 5/3696; H04N 5/374; H04N 5/378; H04N 9/045
See application file for complete search history.

(56) References Cited

U.S. PATENT DOCUMENTS

| 4,936,190 A | 6/1990 | Pilcher |
|---|---|---|
| 6,750,523 B2 | 6/2004 | Blanchard |
| 7,075,049 B2 | 7/2006 | Rhodes et al. |

(Continued)

OTHER PUBLICATIONS

Janssens, U.S. Appl. No. 15/140,152, filed Apr. 27, 2016.
Janssens, U.S. Appl. No. 15/480,076, filed Apr. 5, 2017.
Janssens, U.S. Appl. No. 15/480,078, filed Apr. 5, 2017.

*Primary Examiner* — Luong T Nguyen
(74) *Attorney, Agent, or Firm* — Treyz Law Group, P.C.; Joseph F. Guihan

(57) ABSTRACT

Image sensors may include an array of pixels each having nested sub-pixels. Nested sub-pixels may include an inner photosensitive region and an outer photosensitive region. Inner photosensitive regions of pixels in an array may be provided with a respective local vertical transfer gate structure formed in a trench that laterally surrounds the inner photosensitive region. A trench structure may be formed in a grid-like pattern having gaps in which the nested sub-pixels are formed. The trench structure may be coupled to outer photosensitive regions of each of the pixels in the array. The trench structure may be a global vertical transfer gate structure. The vertical transfer gate structures provided to the pixels may allow for accumulated charges to be transferred to respective charge storage nodes associated with the photosensitive regions in any given pixel. Image sensors formed in this way may be used in rolling shutter or global shutter configurations.

18 Claims, 17 Drawing Sheets

(51) Int. Cl.
*H04N 5/359* (2011.01)
*H04N 9/04* (2006.01)

(56) References Cited

U.S. PATENT DOCUMENTS

| | | |
|---|---|---|
| 7,208,742 B1 | 4/2007 | Zelakiewicz et al. |
| 7,332,786 B2 | 2/2008 | Altice et al. |
| 7,432,540 B2 | 10/2008 | McKee |
| 7,718,459 B2 | 5/2010 | Patrick et al. |
| 7,768,047 B2 | 5/2010 | Mauritzson et al. |
| 7,728,896 B2 | 6/2010 | McKee |
| 7,884,402 B2 | 2/2011 | Ki |
| 8,077,237 B2 | 12/2011 | Li |
| 8,089,036 B2 | 1/2012 | Manabe |
| 8,792,029 B2 | 7/2014 | Lee |
| 9,118,883 B2 | 8/2015 | Wan |
| 10,334,191 B1* | 6/2019 | Yang .................. H04N 5/35563 |
| 2007/0035649 A1 | 2/2007 | McKee |
| 2008/0046063 A1 | 2/2008 | Boatman et al. |
| 2008/0079030 A1* | 4/2008 | Hsu .................. H01L 27/14645 257/225 |
| 2009/0108176 A1 | 4/2009 | Blanquart |
| 2009/0237540 A1 | 9/2009 | Johnson |
| 2009/0302358 A1* | 12/2009 | Mao .................. H01L 27/14603 257/292 |
| 2011/0057238 A1 | 3/2011 | Merrill et al. |
| 2011/0096208 A1 | 4/2011 | Roy et al. |
| 2015/0048427 A1* | 2/2015 | Hu .................. H01L 27/14643 257/239 |
| 2016/0351604 A1 | 12/2016 | Kalnitsky et al. |
| 2017/0324917 A1 | 11/2017 | Mlinar et al. |
| 2017/0373105 A1* | 12/2017 | Galor Gluskin ........................... H01L 27/14603 |
| 2018/0197910 A1* | 7/2018 | Lee ........................ H04N 5/353 |

\* cited by examiner

IMAGE SENSORS WITH MULTI-PHOTODIODE IMAGE PIXELS AND VERTICAL TRANSFER GATES

BACKGROUND

This relates generally to imaging devices, and more particularly, to imaging devices with multi-photodiode image pixels controlled using vertical transfer gates.

Image sensors are commonly used in electronic devices such as cellular telephones, cameras, and computers to capture images. In a typical arrangement, an electronic device is provided with an array of image pixels arranged in pixel rows and pixel columns.

Conventional image sensors include photodiodes formed using dopant implantation. Image pixels are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. A single image sensing pixel in the two-dimensional array of conventional image sensing pixels includes a single photosensitive region, a color filter formed over the photosensitive region, and a single dome-shaped micro-lens formed over the color filter.

There is often undesired electrical cross-talk between adjacent pixels associated with different colors. Undesired electrical cross-talk is characterized by photogenerated charges generated in the semiconductor region of a pixel associated with one color being collected by the photosensitive region (i.e., the photodiode) of a pixel associated with a different color. An example of undesired electrical cross-talk is when photogenerated charges that were generated in response to red light diffuse into and are collected by a photosensitive region associated with a green pixel (i.e., a photosensitive region that should receive green light and generate charges corresponding to the amount of green light received). Electrical cross-talk can also degrade the output image quality of an imager.

Moreover, in conventional imaging systems, image artifacts may be caused by moving objects, a moving or shaking camera, flickering lighting, and objects with changing illumination in an image frame. Such artifacts may include, for example, missing parts of an object, edge color artifacts, and object distortion. Examples of objects with changing illumination include light-emitting diode (LED) traffic signs (which can flicker several hundred times per second) and LED brake lights or headlights of modern cars.

Conventional imaging systems also can have images with artifacts associated with low dynamic range. Scenes with bright and dark portions may produce artifacts in conventional image sensors, as portions of the image may be over exposed or under exposed. High dynamic range operation of pixels without the introduction of additional motion artifacts is an important requirement in many applications. An example of an application in which both high dynamic range operation of an image sensor and artifact-free images are critical is the automotive industry, where image sensors may be used at least in part to determine the course and/or operation of a motor vehicle.

It is therefore desirable to be able to provide improved image pixels and image sensors for imaging devices.

DETAILED DESCRIPTION

Embodiments of the present invention relate to image sensors, and more particularly, to image sensors having pixels that each contain multiple sub-pixel structures. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an image. The image sensors may include arrays of image pixels. The image pixels in the image sensors may include photosensitive elements such as photodiodes that convert the incoming light into electric charge. The electric charges may be stored and converted into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Image sensors may be provided with one or more arrays of multi-photodiode image pixels (sometimes referred to herein as donut photodiode pixels, donut image pixels, donut pixels, nested sub-pixels, super-pixels, image pixels, or pixels). Multi-photodiode image pixels may include photosensitive elements formed in a substrate and that are adjacent to one another. Each multi-photodiode image pixel may have two, three, five, nine, or any other suitable number of photodiodes. The multiple photodiodes in each donut pixel may be grouped into an outer sub-pixel group and an inner sub-pixel group. It may be desirable for the outer sub-pixel group of a donut pixel to be more sensitive to incident light than the inner sub-pixel group. The outer sub-pixel group may include one, two, four, eight, or any other suitable of sub-pixels. The inner sub-pixel group may include one or more sub-pixels. One or more microlenses or other light guiding structures may be formed over the multi-sub-pixel image pixel to direct light to the photodiode(s) in the outer sub-pixel group.

Figure 1:
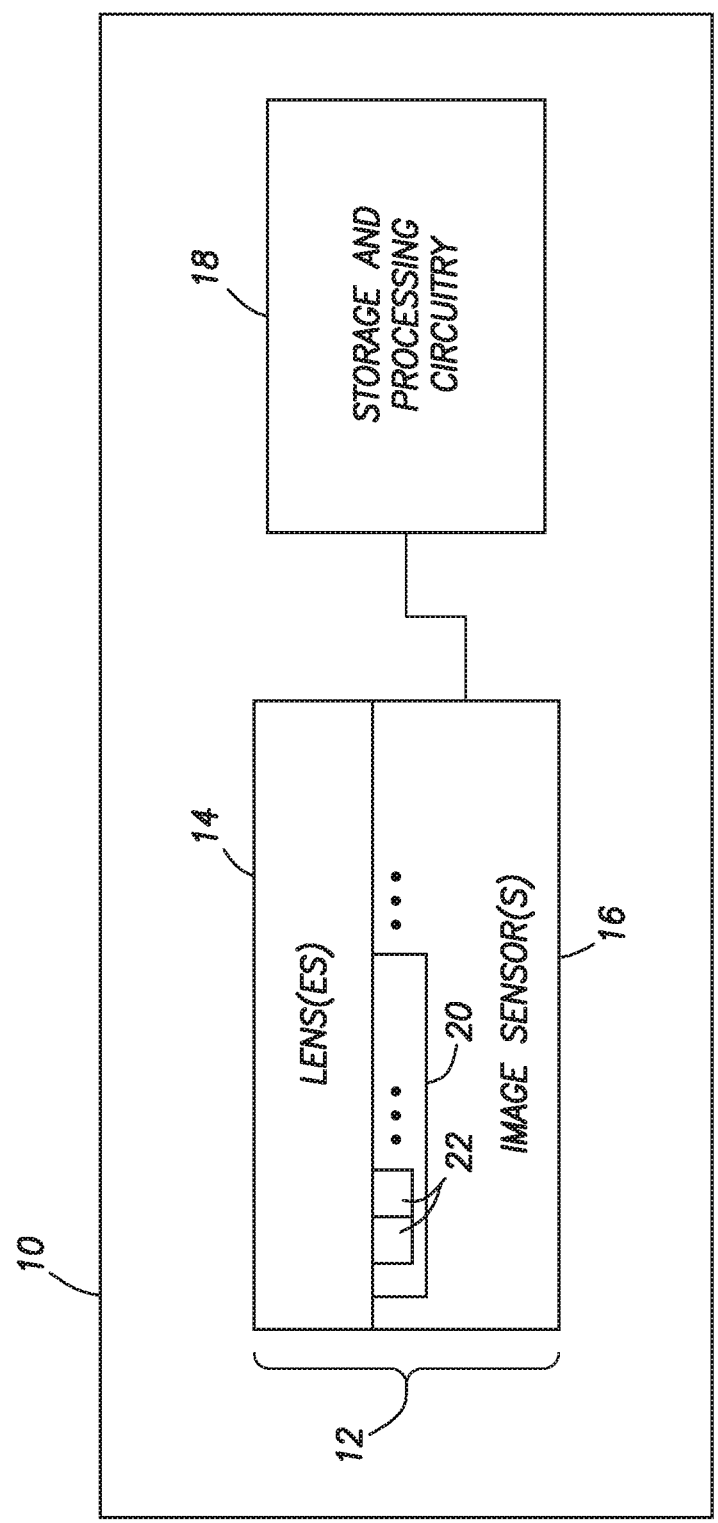
FIG. 1 is a diagram of an illustrative electronic device that uses an image sensor to capture images in accordance with an embodiment.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 provides corresponding digital image data to processing circuitry 18. Image sensor 16 may, for example, be a backside illumination image sensor. If desired, camera module 12 may be provided with an array of lenses 14 and an array of corresponding image sensors 16.

Control circuitry such as storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices. Image pixels 22 may be frontside illumination (FSI) image pixels or backside illumination (BSI) image pixels. Image pixels 22 may include one or more sub-pixels. Each sub-pixel in an image pixel 22 may have a photodiode or photodiode region and readout circuitry for the photodiode or photodiode region. Readout circuitry associated with each photodiode or photodiode region in a given sub-pixel may include transfer gates, floating diffusion regions, and reset gates. Isolation regions between sub-pixels may also be considered part of either or both of the sub-pixels between which the isolation structure is formed.

An image sensor 16 may be provided with control circuitry that provides the pixel supply voltage (such as VAA), pixel ground voltage, intermediate fixed voltages (i.e., fixed voltages between VAA and the pixel ground voltage), and control signals to the transistors of the pixel circuits in each of the image pixels 22. The sensor control circuitry may provide control signals for the transfer transistors, charge overflow transfer transistors, reset transistors, row select transistors, anti-blooming transistors, or generally, any transistors in the pixel circuit or pixel readout circuitry coupled to the pixels.

Figure 2:
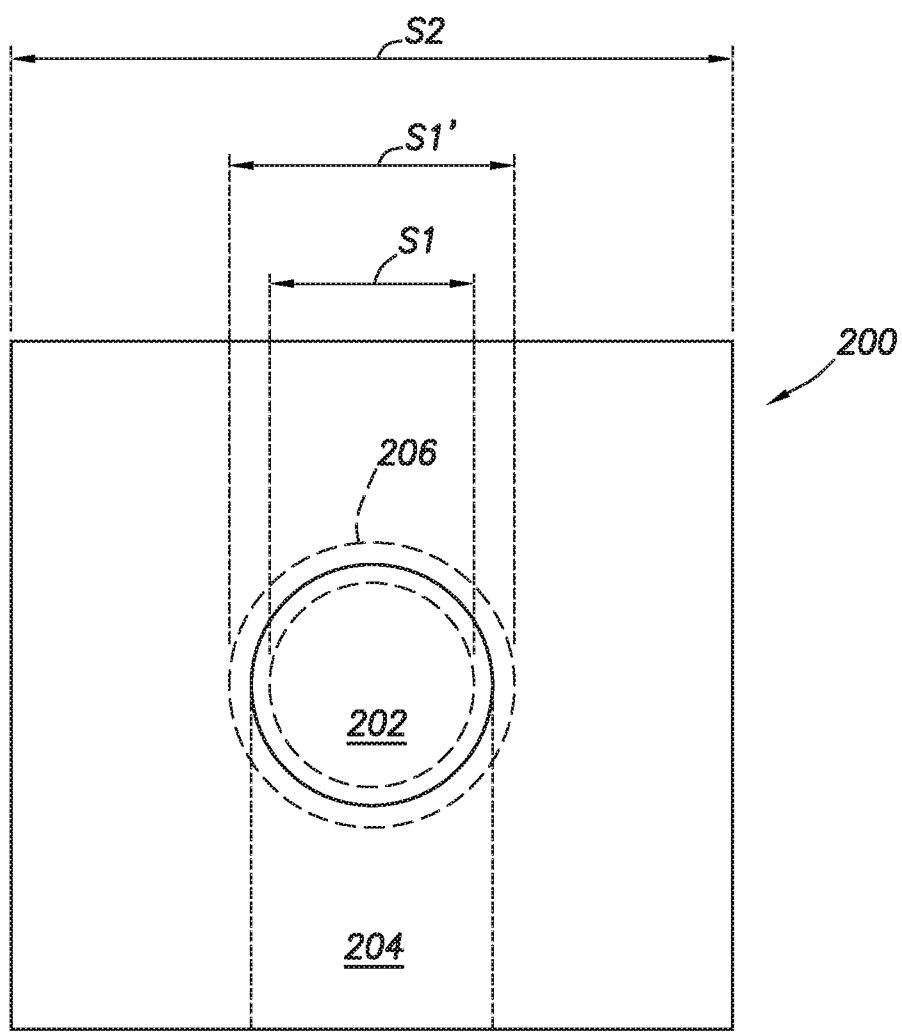
FIG. 2 is a surface view of nested sub-pixels with an inner sub-pixel having a circular light collecting surface in accordance with an embodiment.

FIG. 2 is a surface view of nested sub-pixels 200 in a pixel 22 of array 20 in accordance with an embodiment. Nested sub-pixels 200 may be an alternate embodiment to the nested sub-pixels of FIGS. 3-5. The surface view of the nested sub-pixels 200 of FIG. 2 may be referred to as a diagram of the light collecting areas (LCAs) of the nested sub-pixels 200. Nested sub-pixels 200 may correspond to photodiodes with associated pixel circuitry used to capture the same spectrum of light. As an example, the nested sub-pixels 200 may be used to capture red, green, blue, cyan, magenta, yellow, near-infrared, infrared, or any other spectrum of light. A single red, green, blue, cyan, magenta, yellow, near-infrared, infrared, or clear color filter may be formed over the nested sub-pixels 200. In certain embodiments, the color filter formed over nested sub-pixels 200 may have areas that pass colored light and areas that are clear (i.e., that pass visible or full-spectrum light outside the visible spectrum).

Nested sub-pixels 200 shown in FIG. 2 may be included in a subset of the pixels 22 of array 20, or in all of the pixels 22 of array 20. The nested sub-pixels 200 of FIG. 2 may include a first sub-pixel 202, which may be referred to as the inner sub-pixel 202. Inner sub-pixel 202 may be completely surrounded by a second sub-pixel 204, which may be referred to as the outer sub-pixel 204. Inner sub-pixel 202 and outer sub-pixel 204 may correspond to n-type doped photodiode regions in a semiconductor substrate and respective sub-pixel circuitry in the substrate such as transfer gates, floating diffusion regions, and reset gates of the nested sub-pixels 200 that is coupled to the photodiode regions in the sub-pixels 202 and 204. The semiconductor substrate (not shown) may be a bulk p-type substrate made of silicon, or any other suitable semiconductor material.

A photodiode in inner sub-pixel 202 may have a circular shape at the surface. In other words, the light collecting area of inner sub-pixel 202 is a circular region. At the surface, the inner sub-pixel 202 may have a diameter S1. As an example, the diameter S1 of a photodiode in inner sub-pixel 202 may be 1 micron, but may alternatively be any other dimension without departing from the scope of the present embodiment. Outer sub-pixel 204 may have a square outer boundary and a circular inner boundary at the surface. The area enclosed by the square outer boundary and circular inner boundary of outer sub-pixel 204 shown in FIG. 2 may correspond to the light collecting area of outer sub-pixel 204. The circular inner boundary of outer sub-pixel 204 at the surface may be similar in shape but larger in size to the outer boundary of the inner sub-pixel 202 (i.e., the circular inner boundary of outer sub-pixel 204 has a diameter S1' that is greater than the diameter S1). As shown in FIG. 2, the length of one of the sides of outer sub-pixel 204 is S2. As an example, S2 may be 3 microns, but may alternatively be any other dimension without departing from the scope of the present embodiment. The length S2 is preferably greater than the length S1. Outer sub-pixel 204 is illustrated in FIG. 2 as having a square outer boundary but may alternatively have a rectangular outer boundary.

In between the inner sub-pixel 202 and the outer sub-pixel 204, an isolation region 206 may be formed. The isolation region 206 may be devoid of any circuitry related to the pixel 22 or its sub-pixels 202 and 204. Isolation region 206 may separate individual sub-pixels in a given sub-pixel group from one another, and may also separate individual sub-pixels in different respective sub-pixel groups from one another. Isolation region 206 may include different types of isolation devices such as trench isolation structures, doped semiconductor regions, metallic barrier structures, or any other suitable isolation device. As a particular example, a vertical transfer gate structure may be formed in the isolation region 206. A vertical transfer gate structure formed in isolation region 206 may be used for more than mere isolation—control signals may be applied to a vertical transfer gate structure formed in the isolation region 206 to move charges accumulated in at least one of the photodiodes in the nested sub-pixels 200 to a floating diffusion region.

The inner sub-pixel 202 may have a lower sensitivity to incident light, and may be referred to as having a lower sensitivity light collecting area compared to outer sub-pixel 204. The respective doping concentrations of inner sub-pixel 202 and outer sub-pixel 204 may be different or they may be the same. As an example, the doping concentrations of photodiode regions in inner sub-pixel 202 may be modified to reduce the sensitivity of inner sub-pixel 202 to light. However, for the sake of simplicity in explaining and highlighting the properties of the nested sub-pixels 200, it will be assumed that the sub-pixels 202 and 204 have photodiodes with the same doping concentrations. The lower sensitivity to incident light of inner sub-pixel 202 compared to outer sub-pixel 204 may be a result of the lower light collecting area of inner sub-pixel 202 compared to the light collecting area of outer sub-pixel 204.

One or more microlenses (not shown in FIG. 2) may be formed over the nested sub-pixels 200 of FIG. 2 to direct light toward the outer sub-pixel 204. The one or more microlenses may be formed over the color filter formed over nested sub-pixels 200 (not shown in FIG. 2). To direct light toward outer sub-pixel 204, the one or more microlenses may be formed over only outer sub-pixel 204. In some embodiments however, the one or more microlenses that direct light toward outer sub-pixel 204 may partially overlap the light collecting area of sub-pixel 202. Directing light toward outer sub-pixel 204 may further increase the sensitivity of the light collecting area of outer sub-pixel 204, relative to the sensitivity of the light collecting area of inner sub-pixel 202. In other words, because a larger amount of light incident on nested sub-pixels 200 is directed to outer sub-pixel 204 than to inner sub-pixel 202, inner sub-pixel 202 is said to have a lower sensitivity light collecting area compared to outer sub-pixel 204.

When a single color filter is formed over nested sub-pixels 200, the inner sub-pixel 202 and outer sub-pixel 204 receive incident light 210 of the same color. The electrical cross talk between sub-pixels 202 and 204 is therefore cross-talk between sub-pixels receiving light of the same color, and is therefore manageable before or after the readout of the pixel 22 in which nested sub-pixels 200 are located.

When a first sub-pixel structure is said to be nested within a second sub-pixel structure, it is entailed that the first sub-pixel structure is laterally surrounded by the second sub-pixel structure as illustrated in at least FIGS. 2-5. Taking FIG. 2 as an example, it can be appreciated that the outer sub-pixel structure 204 laterally surrounds the inner sub-pixel structure 202. In other words, outer sub-pixel 204 surrounds the inner sub-pixel 202 except at front and back surfaces of the inner sub-pixel 202 such as the surface shown in FIG. 2 itself (i.e., outer sub-pixel 204 laterally surrounds inner sub-pixel 202). When a first sub-pixel structure is said to be nested within a second sub-pixel structure, it is also entailed that no additional intervening pixels or sub-pixels are formed in a region between the first and second sub-pixels. Again, taking FIG. 2 as an example, it can be appreciate that any space between sub-pixels 202 and 204 is free from additional pixel or sub-pixel structures.

Two sub-pixels may properly thought to be nested when one of the sub-pixels laterally surrounds the other sub-pixel and when any space between the sub-pixels is devoid of any other pixel or sub-pixel structures. When a first sub-pixel is nested within a second sub-pixel the aforementioned sense, the second sub-pixel can also be said to "immediately surround" the first sub-pixel.

While the above definition of nesting or "immediate surrounding" was described in connection with two sub-pixels, a sub-pixel group may also be properly be thought to immediately surround another sub-pixel or sub-pixel group. When a sub-pixel is laterally surrounded by a sub-pixel group that includes multiple sub-pixels, and when any space between the sub-pixel and the sub-pixel group is devoid of any other sub-pixels or pixels, the sub-pixel is immediately surrounded by, or nested within, the sub-pixel group. In a similar manner, a first sub-pixel group may be immediately surrounded by, or nested within, a second sub-pixel group.

Figure 3:
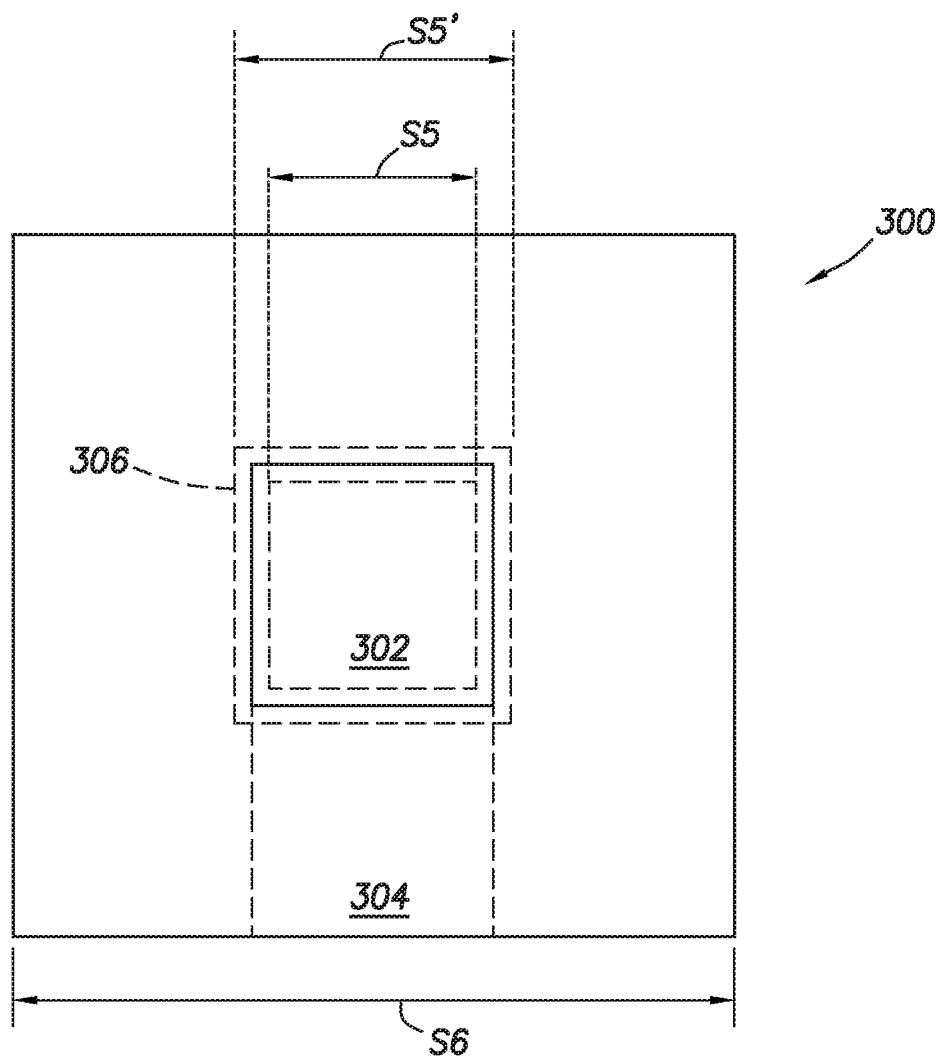
FIG. 3 is a surface view of nested sub-pixels with an inner sub-pixel having a rectangular light collecting surface in accordance with an embodiment.

The light collecting area of the innermost sub-pixel structure of a pixel may influence or help determine the shape of additional sub-pixel structures in the pixel within which the innermost sub-pixel structure is nested. As seen in FIG. 2, for example, the shape of the light collecting area of inner sub-pixel 202 determines the shape of the light collecting area of outer sub-pixel 204. Specifically, because the outer boundary of inner sub-pixel 202 (i.e., the interface of inner sub-pixel 202 and the isolation region 206 or outer sub-pixel 204) is circular, the inner boundary of the outer sub-pixel 204 also has a circular shape. When, as described above, a pixel has any number of nested sub-pixels, the shape of the light collecting area of the innermost sub-pixel or sub-pixel group may be elliptical, circular (as shown in FIG. 2), rectangular, or square (as shown in FIG. 3). Pixels are not limited in the number of nested sub-pixels they can have by the shape of the light collecting area of their innermost sub-pixel. In other words, the number of nested sub-pixels may be increased regardless of whether the innermost sub-pixel is elliptical, circular, rectangular, or square. Generally, when a sub-pixel group or an individual sub-pixel is referred to as having an elliptical shape, the sub-pixel group or individual sub-pixel may have a circular shape or any other elliptical shape. Similarly, when a sub-pixel group or an individual sub-pixel is referred to as having a rectangular shape, the sub-pixel group or individual sub-pixel may have a square shape or any other rectangular shape.

FIG. 3 is a surface view of nested sub-pixels 300 in a pixel 22 of array 20. Nested sub-pixels 300 may be an alternate embodiment to the nested sub-pixels of FIGS. 2, 4, and 5. The surface view of the nested sub-pixels 300 of FIG. 3 may be referred to as a diagram of the light collecting areas (LCAs) of the nested sub-pixels 300. Nested sub-pixels 300 may correspond to sub-pixels used to capture the same spectrum of light. As an example, the nested sub-pixels 300 may be used to capture red, green, blue, cyan, magenta, yellow, near-infrared, infrared, or any other spectrum of light. A single red, green, blue, cyan, magenta, yellow, near-infrared, infrared, or clear color filter may be formed over the nested sub-pixels 300. In certain embodiments, the color filter formed over nested sub-pixels 300 may have areas that pass colored light and other areas that are clear (i.e., that pass visible spectrum light).

Nested sub-pixels 300 shown in FIG. 3 may be included in a subset of the pixels 22 of array 20, or in all of the pixels 22 of array 20. The nested sub-pixels 300 of FIG. 3 may include a first sub-pixel 302, which may be referred to as the inner sub-pixel 302. Inner sub-pixel 302 may be completely surrounded by a second sub-pixel 304, which may be referred to as the outer sub-pixel 304. Inner sub-pixel 302 and outer sub-pixel 304 may correspond to n-type doped photodiode regions in a semiconductor substrate and respective sub-pixel circuitry in the substrate such as transfer gates, floating diffusion regions, and reset gates of the nested sub-pixels 300 that is coupled to the photodiode regions in the sub-pixels 302 and 304. The semiconductor substrate (not shown) may be a bulk p-type substrate made of silicon, or any other suitable semiconductor material.

Inner sub-pixel 302 may have a square shape at the surface. In other words, the light collecting area of inner sub-pixel 302 is a square region. Generally, the inner sub-pixel 302 may have a rectangular light collecting area. At the surface, the inner sub-pixel 302 may have a width S5. As an example, the width S5 of inner sub-pixel 302 may be 1 micron, but may alternatively be any other dimension without departing from the scope of the present embodiment. Outer sub-pixel 304 may have a square outer boundary and a square inner boundary at the surface. The area enclosed by the square outer boundary and inner boundary of outer sub-pixel 304 shown in FIG. 3 may correspond to the light collecting area of outer sub-pixel 304. The square inner boundary of outer sub-pixel 304 at the surface may be similar in shape but larger in size to the outer boundary of the inner sub-pixel 302 (i.e., the square inner boundary of outer sub-pixel 304 has a width S5' that is greater than the width S5). As shown in FIG. 3, the length of one of the sides of the outer boundary of outer sub-pixel 304 is S6. As an example, S6 may be 3 microns, but may alternatively be any other dimension without departing from the scope of the present embodiment. The width S6 is preferably greater than the widths S5 and S5'. Outer sub-pixel 304 is illustrated in FIG. 3 as having a square outer boundary, but may alternatively have a rectangular outer boundary. Similarly, the outer boundary of inner sub-pixel 302 and the inner boundary of outer sub-pixel 304 may be rectangular as well.

In between the inner sub-pixel 302 and the outer sub-pixel 304, an isolation region 306 may be formed. The isolation region 306 may be devoid of any circuitry related to the pixel 22 or its sub-pixels 302 and 304. Isolation region 306 may separate individual sub-pixels in a given sub-pixel group from one another, and may also separate individual sub-pixels in different respective sub-pixel groups from one another. Isolation region 306 may include different types of isolation devices such as trench isolation structures, doped semiconductor regions, metallic barrier structures, or any other suitable isolation device.

The inner sub-pixel 302 may have a lower sensitivity to incident light, and may be referred to as having a lower sensitivity light collecting area (or more simply, size) compared to outer sub-pixel 304. The respective doping concentrations of inner sub-pixel 302 and outer sub-pixel 304 may be different or they may be the same. As an example, the doping concentrations of photodiode regions in inner sub-pixel 302 may be modified to reduce the sensitivity of inner sub-pixel 302 to light. However, for the sake of simplicity in explaining and highlighting the properties of the nested sub-pixels 300, it will be assumed that the sub-pixels 302 and 304 have photodiodes with the same doping concentrations. The lower sensitivity to incident light of inner sub-pixel 302 compared to outer sub-pixel 304 may be a result of the lower light collecting area of inner sub-pixel 302 compared to the light collecting area of outer sub-pixel 304. It will be assumed for the purposes of explaining the embodiment that lower light sensitivity of the inner sub-pixel 302 relative to the light sensitivity of outer sub-pixel 304 is due to the smaller size, or more specifically the smaller light collecting area, of the inner sub-pixel 302 relative to the outer sub-pixel 304.

One or more microlenses (not shown in FIG. 3) may be formed over the nested sub-pixels 300 of FIG. 3 to direct light toward the outer sub-pixel 304. The one or more microlenses may be formed over the color filter formed over nested sub-pixels 300 (not shown in FIG. 3). To direct light toward outer sub-pixel 304, the one or more microlenses may be formed over only outer sub-pixel 304. In some embodiments however, the one or more microlenses that direct light toward outer sub-pixel 304 may partially overlap the light collecting area of sub-pixel 302. Directing light toward outer sub-pixel 304 may further increase the sensitivity of the light collecting area of outer sub-pixel 304, relative to the sensitivity of the light collecting area of inner sub-pixel 302. In other words, because a larger amount of light incident on nested sub-pixels 300 is directed to outer sub-pixel 304 than to inner sub-pixel 302, inner sub-pixel 302 is said to have a lower sensitivity light collecting area compared to outer sub-pixel 304.

Isolation region 306 may be perpendicular to the light collecting surface of nested sub-pixels 300.

Photogenerated charges in outer photodiode 304 may leak or diffuse across isolation region 306 and into inner sub-pixel 302. Isolation devices used in the isolation region 306 may include isolation structures of various types, such as trench isolation structures, doped semiconductor regions, and metallic barriers, which may be formed in one or both of the first and second regions of isolation region 306. When the same type of isolation device is formed in both the first and second regions of isolation region 306 (i.e., when a single isolation device type is formed in isolation region 306) the isolation device in region 306 may be continuous.

As a particular example, a vertical transfer gate structure may be formed in the isolation region 306. A vertical transfer gate structure formed in isolation region 306 may be used for more than mere isolation—control signals may be applied to a vertical transfer gate structure formed in the isolation region 306 to move charges accumulated in at least one of the photodiodes in the nested sub-pixels 300 to a floating diffusion region The leaking of charge from one photodiode region of a sub-pixel into another photodiode region of another sub-pixel is generally referred to as electrical cross-talk. Because a single color filter is formed over nested sub-pixels 300, the inner sub-pixel 302 and outer sub-pixel 304 receive incident light 310 of the same color. As a result, photogenerated charge that diffuses or leaks from outer photodiode 304 across isolation region 306 into inner sub-pixel 302 is corresponds to charge produced in response to the same color that produced photogenerated charges in inner photodiode 302. The electrical cross talk between photodiode regions in sub-pixels 302 and 304 is therefore cross-talk between photodiodes receiving light of the same color, and is therefore manageable. The electrical cross talk between photodiodes in sub-pixels 302 and 304 may be accounted for or managed during readout of the pixel 22 in which nested sub-pixels 300 are located, or after the readout of the pixel 22 in which the nested sub-pixels 300 are located.

While the examples of FIGS. 2 and 3 respectively relate to nested pixels with elliptical and rectangular inner sub-pixels, the inner sub-pixels of nested sub-pixels may have any shape. As an example, the inner sub-pixels of nested sub-pixels may have a pentagonal, hexagonal, heptagonal, or octagonal shape. In general, the inner sub-pixels may have any polygonal shape. As the shape of the inner sub-pixel determines the shape of the inner boundary of the sub-pixel in which it is nested, the shape of the nesting sub-pixels that surround the inner sub-pixel may also be any polygonal shape. The outer boundary of the outer-most nested sub-pixel (i.e., the outer boundary of the pixel 22) may have a diamond shape, a square shape, a rectangular shape, or any other suitable polygonal shape.

Figure 4:
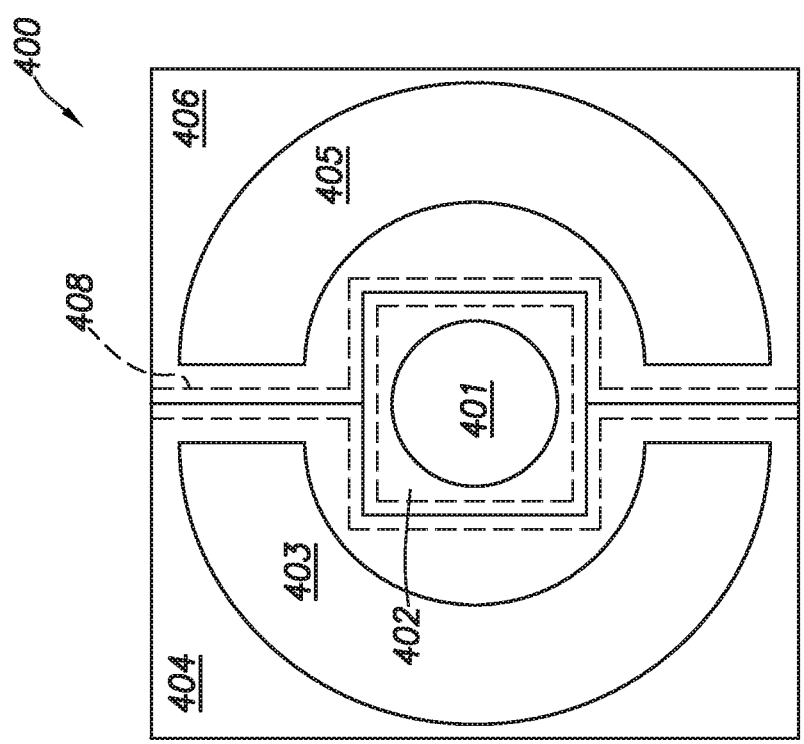
FIG. 4 is a surface view of nested sub-pixels with an inner sub-pixel having a circular light collecting surface that is surrounded by an outer sub-pixel group of two sub-pixels, in accordance with an embodiment.

FIG. 4 is a surface view of nested sub-pixels with an inner sub-pixel having a circular light collecting surface that is surrounded by an outer sub-pixel group of two sub-pixels, in accordance with an embodiment. FIG. 4 is a surface view of nested sub-pixel groups 400 in a pixel 22 of array 20. Nested sub-pixel groups 400 may be an alternate embodiment to the nested sub-pixel groups shown in FIG. 2. FIG. 4 and FIGS. 2/3 differ in that the outer sub-pixel 204/304 in FIG. 2/3 may be divided into an outer left sub-pixel 404 and an outer right sub-pixel 406 in FIG. 4. Additionally, the outer boundary of the inner sub-pixel 402 in FIG. 4 is square or rectangular, while the outer boundary of the inner sub-pixel 202 in FIG. 2 is circular or elliptical. However, in the context of FIG. 4, the inner sub-pixel 402 may have a circular or elliptical outer boundary without departing from the scope of the present invention.

Outer left sub-pixel 404 and outer right sub-pixel 406 may form an outer sub-pixel group, in which the inner sub-pixel 402 is nested. The descriptions of sub-pixel structure described in FIG. 2 is also applicable to the nested sub-pixels 400 of FIG. 5, with the necessary modifications that take into account the division of outer sub-pixel 204 into outer left sub-pixel 204 and outer right sub-pixel 206. An example of such a necessary modification is the shape of the isolation region 408. Similar to FIG. 2, in which the isolation region 206 is formed between sub-pixels 202 and 204, the isolation region 408 is formed between each of the sub-pixels 402, 404, and 406. Additionally, the descriptions related to the placement of one or more microlenses over nested sub-pixels 200 in FIG. 2 are also applicable to the nested sub-pixel 500 of FIG. 5, with the necessary modifications that take into account the division of outer sub-pixel 204 into outer left sub-pixel 404 and outer right sub-pixel 406.

In the event that a vertical transfer gate is formed as a part of any isolation structure in the region 408.

Generally, one or more outer sub-pixels or sub-pixel groups having either rectangular, square, elliptical, or circular inner boundaries may be divided into respective divided sub-pixel groups having additional sub-pixels compared to the original sub-pixel or sub-pixel groups.

Within the inner sub-pixel 402, a photodiode 401 may be formed. The light collecting surface/area of the photodiode 401 may be a circle and may occupy only a portion of the inner sub-pixel 402. Within the outer sub-pixel 404, a photodiode 403 may be formed. The light collecting surface/area of the photodiode 403 may have a half-torus or half-donut shape. Within the outer sub-pixel 406, a photodiode 405 may be formed. The light collecting surface/area of the photodiode 405 may have a half-torus or half-donut shape.

Figure 5:
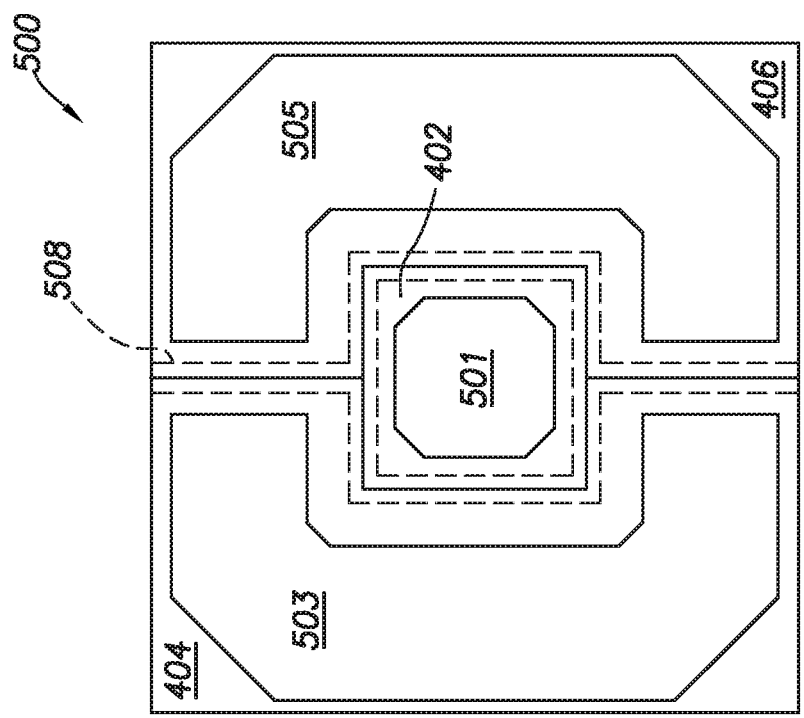
FIG. 5 is a surface view of nested sub-pixels with an inner sub-pixel having a polygonal light collecting surface that is surrounded by an outer sub-pixel group of two sub-pixels, in accordance with an embodiment.

FIG. 5 is a surface view of nested sub-pixels with an inner sub-pixel having a polygonal light collecting surface that is surrounded by an outer sub-pixel group of two sub-pixels, in accordance with an embodiment. FIG. 5 is substantially similar to FIG. 4, but differs in that the photodiodes formed in the outer sub-pixel group have a light collecting surface/area with a polygonal shape and the photodiode in the inner sub-pixel group also has a light collecting surface/area with a polygonal shape. The photodiode 501 in the inner sub-pixel 402 may have an octagonal shape that is formed in only a portion of the area of the inner sub-pixel 402. Generally, however, the shape of the photodiode 501 may be a polygon of having any number of sides greater than three. The photodiode 503 may be an 11-sided polygon with a shape that approximates a half torus or a half donut. Generally, the shape of the photodiode 501 may be a polygon of having any number of sides greater than three that preferably fills or occupies a portion of the outer left sub-pixel 404. The photodiode 505 may be an 11-sided polygon with a shape that approximates a half torus or a half donut. Generally, the shape of the photodiode 505 may be a polygon of having any number of sides greater than three that preferably fills or occupies a portion of the outer right sub-pixel 404.

Generally, while the pixels 400 and 500 of FIGS. 4 and 5 are shown as having two outer photodiodes in the outer photodiode group (i.e., photodiodes 403/405 in pixel 400 and photodiode 503/505 in pixel 500), the outer photodiode group in the pixels 400 and 500 may instead have a single photodiode in the outer photodiode group.

Figure 6:
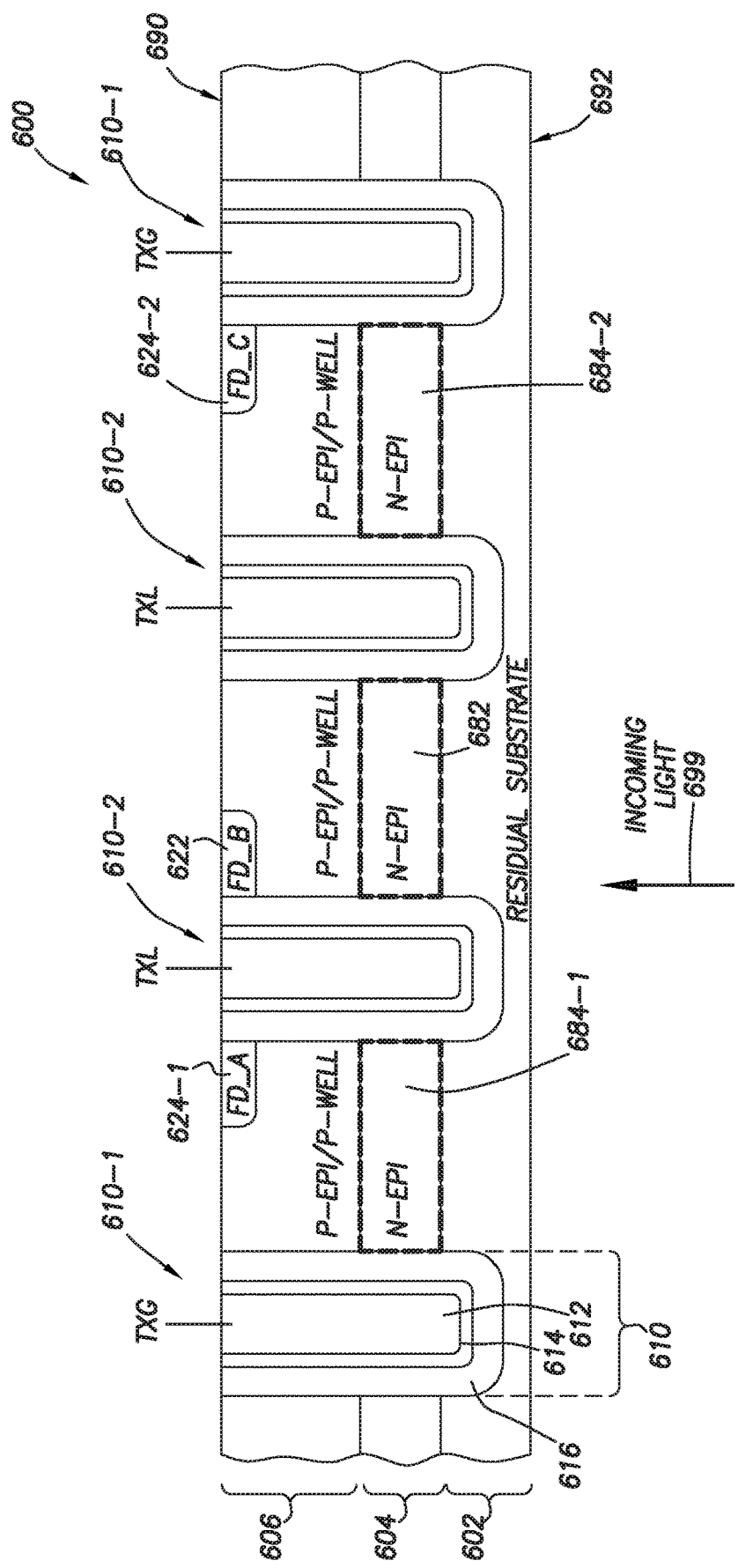
FIG. 6 is a cross-sectional side view of an image pixel with nested sub-pixels in an image sensor formed from at least one epitaxial layer and provided with vertical charge transfer structures, in accordance with at least some embodiments.

FIG. 6 is a cross-sectional side view of an image pixel with nested sub-pixels in an image sensor such as sensor 16 of FIG. 1 formed from at least one epitaxial layer and provided with vertical charge transfer structures. As shown in FIG. 6, sensor 600 may include a residual substrate 602 (e.g., a p-type or n-type substrate for providing a clean crystalline layer for subsequent epitaxial growth), an n-type epitaxial ("n-epi") layer 604 grown on residual substrate 602, and a p-type epitaxial ("p-epi") layer 606 grown on n-epi layer 604. Optionally, layer 606 may also be a layer in which a p-well is formed. The epitaxial layer(s) can be formed via vapor-phase epitaxy, liquid-phase epitaxy, solid-phase epitaxy, or other types of chemical deposition. Epitaxial layers may be doped either n-type or p-type during chemical vapor deposition (as an example) by adding impurities to the source gas.

A substrate that eventually becomes residual substrate 602 may have an n-type epitaxial layer (such as the layer 604) grown over it. Subsequently, a p-type epitaxial layer (such as the layer 606) may be grown over the n-type epitaxial layer. After all desired epitaxial layers have been grown, additional semiconductor processing steps may be performed to form trench structures. Etching or other removal techniques may be used to form trenches in the epitaxial layers. A vertical transfer gate structure may be formed in the trenches, or any other suitable isolation structure (such as a passive shallow trench isolation structure) can be created. Then, front side processing of the semiconductor may be performed. In the front side processing of the semiconductor, circuit features such as transistors, gates, or other circuit elements may be formed on the front side 690 of the semiconductor. Frontside pixel structures such as reset gates, source follower transistors, and row-select transistors are not shown so as not to unnecessarily obscure the present embodiment. The front side processed semiconductor wafer may then be placed on a handling wafer, after which the original substrate (on which the n-type and p-type epitaxial layers were grown) is thinned to leave only a residual substrate such as the residual substrate layer 602.

As shown in the example of FIG. 6, incoming light 699 may enter from the back side 692 of the image sensor. This type of imaging configuration is referred to as backside illumination (BSI). If desired, deep epitaxial photodiodes may also be used to support front side illumination (FSI), where light enters from front side 690 of the sensor.

In general, the thicknesses of the epitaxial layers can be adjusted to optimize the responsivity and/or the color selectivity of the photodiodes. The dopant and thicknesses of the epitaxial layers can be independently tailored to make the photodiodes deplete fully at the desired voltage of choice, especially at large depths.

A floating diffusion (FD) region such as n-type regions 624-1, 624-2 and 622 may be formed at the upper (front) surface 690. Additional front-side pixel structures such as reset gates, source follower transistors, and row-select transistors are not shown so as not to unnecessarily obscure the present embodiment.

A deep trench structure such as structures 610 may extend from front surface 690 all the way down to residual substrate 602. The deep trench structures 610 may be used as transfer gates or transfer transistors that are controlled by control signals TXL and TXG. Alternatively, one or more of the deep trench structures 610 may be a passive structure that is not controlled by any control signals. As an example, the deep trench structure 610 may be trench isolation structures or shallow trench isolation (STI) structure. Structures 610 (e.g., local vertical transfer gate 610-2 and global vertical transfer gate 610-1) may be each formed as a trench that includes conductive gate material 612 (e.g., polysilicon, tungsten, or other suitable gate metal), dielectric liner 614 (e.g., a gate oxide liner), and a p-doped region 616 surrounding the trench. Configured in this way, the portion of layer 604 marked within dotted regions 682 and 684 (i.e. regions 684-1 and 684-2) and surrounding p-type regions 616, 606, and 602 may serve as photodiodes (e.g., an epitaxial photodiode or an epitaxial-layer-based photodiode).

Structures such as local vertical transfer gate 610-2 may serve to delimit the border of each inner photodiode and may also serve as a vertical transfer gate structure for transferring accumulated charge from photodiode region 682 to floating diffusion region 622 (FD_B) by asserting charge transfer signal TXL (e.g., vertical transfer gate 610-2 may be in contact with or is coupled to both n-epi region 682 and floating diffusion region FD_B). P-type layer 616 formed at the edges of the trench can help shield the photodiode from being directly exposed to a damaged interface and can also help reduce leakage.

In the case of the local vertical transfer gate 610-2, asserting the TXL signal may also serve to transfer accumulated charge from photodiode region 684-1 to floating diffusion region 624-1 (FD_A) by asserting charge transfer signal TXL (e.g., vertical transfer gate 610-2 may be in contact with or is coupled to both n-epi region 684-1 and floating diffusion region FD_A).

Structures such as global vertical transfer gate 610-1 may serve to delimit the border of each pixel (or, in other words, the borders of each of the outermost sub-pixel groups of each nested sub-pixel in sensor 16) and may also serve as a vertical transfer gate structure for transferring accumulated charge from regions such as the photodiode region 684-2 to floating diffusion region 624-2 (FD_C) by asserting charge transfer signal TXG (e.g., vertical transfer gate 610-1 may be in contact with or is coupled to both n-epi region 684-2 and floating diffusion region FD_C). P-type layer 616 formed at the edges of the trench can help shield the photodiode from being directly exposed to a damaged interface and can also help reduce leakage.

As shown in the example of FIG. 6, incoming light 699 may enter from the back side 692 of the image sensor. This type of imaging configuration is referred to as backside illumination (BSI). If desired, the photodiode configuration of FIG. 6 may also be used to support front side illumination (FSI), where light enters from front side 690 of sensor 600.

Figure 7:
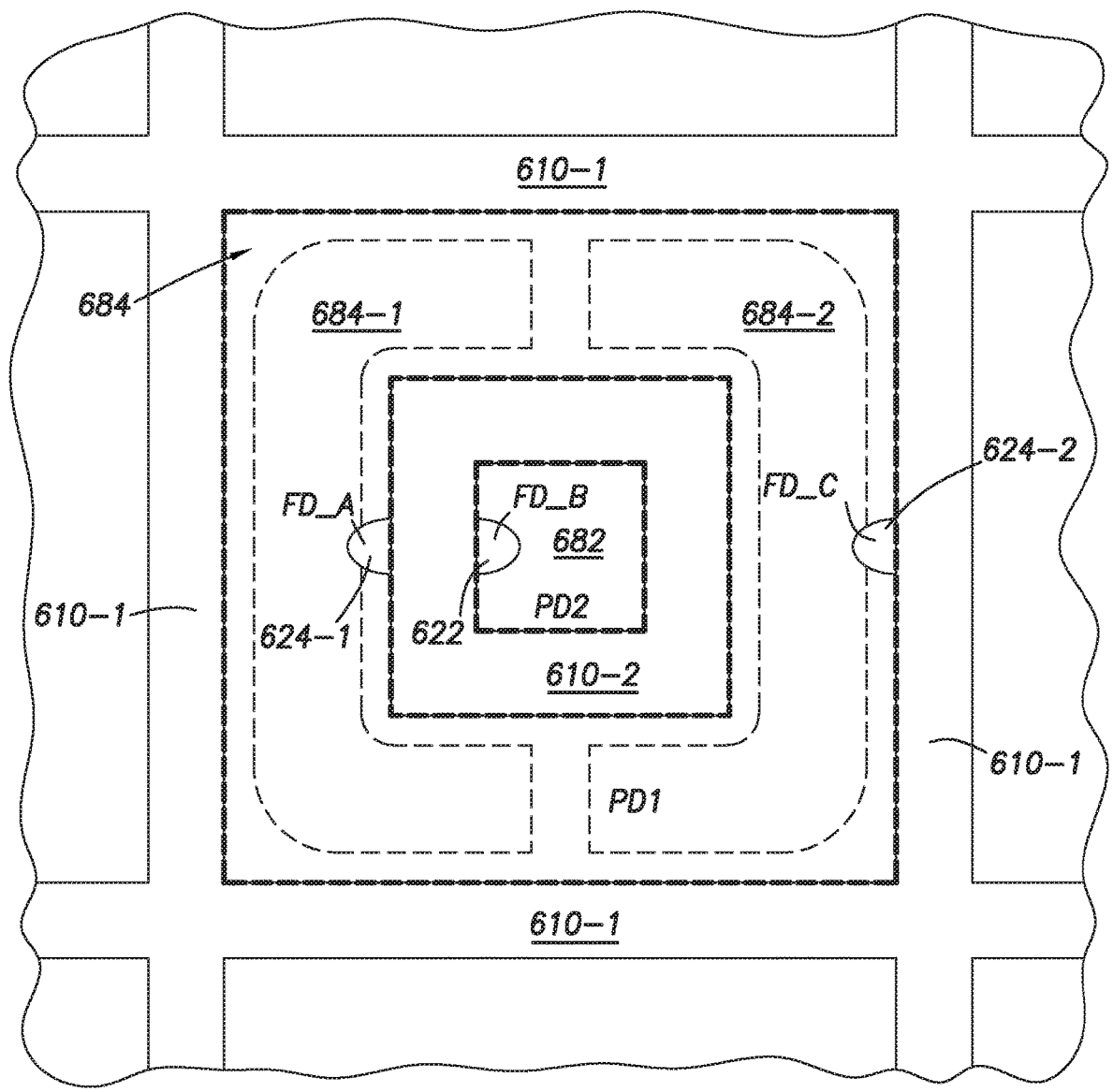
FIG. 7 is a top view of the sensor shown in FIG. 6, in accordance with an embodiment.

FIG. 7 is a top view of the sensor shown in FIG. 6. As shown in FIG. 6, the inner photodiode region 682 may have a rectangular (as shown in FIG. 7 for illustrative purposes), circular, or polygonal shape that is laterally surrounded by the local vertical transfer gate structure 610-2. The actual light collecting photodiode region 682 is not formed at the same depth as the floating diffusion region 622 (FD_B) but are both shown in the top view of FIG. 7 to facilitate illustration of salient features of the embodiment. Rather, the different depths of the regions 682 and 622 relative to the front and back sides of the image sensor are shown in FIG. 6. Similarly, the different depths of regions 684 and the floating diffusion regions 624 relative to the front and back sides of the image sensor are shown in FIG. 6, but are both illustrated in the top view of FIG. 7 to facilitate illustration of salient features of the embodiment.

Because the local vertical transfer gate structures 610-2 laterally surround the boundary of the inner photodiode region 682 for each pixel containing nested sub-pixels, they are formed and controlled on a per-pixel basis (i.e., controllable individually/independently for each pixel—not shared between all pixels). By contrast, the global vertical transfer gate structure 610-1 may be configured as a matrix or mesh of trench structures that form an array of slots in which respective pixels (i.e., the outer sub pixel group with photosensitive regions 684-1/684-2, the local vertical transfer gate 610-2, and the inner sub pixel with photosensitive region 682) are formed. The global vertical transfer gate structure may be viewed as a grid-like structure having gaps in which the pixels are formed. In an embodiment, pixels may retain their respective local vertical transfer gate structures 610-2 and instead of being provided a global vertical transfer gate 610-1 that is coupled to each outer sub-pixel group in the array of pixels, a passive trench isolation structure may be formed in the grid-like pattern illustrated in FIG. 7 in the place of the global vertical transfer gate 610-1.

The floating diffusion regions in the inner and outer sub-pixel groups have a smaller footprint than the photodiode regions 682 and 684 and may be formed directly above those regions (as shown in FIG. 6, for example). In some embodiments, the outer sub-pixel group may have only a single photosensitive region 684 that occupies the entirety of the region between the local and global vertical transfer gate structures 610-2 and 610-1, respectively. The rectangular footprint of photodiode region 684 is merely illustrative. In other embodiments, the outer sub-pixel group may have multiple photosensitive regions such as 684-1 and 684-2, that occupy less than the entire footprint of the region between the local and global vertical transfer gate structures 610-2 and 610-1. If desired, vertical transfer gate structures 610-1 and 610-2 may be configured in any suitable way such that photodiode region 684 can have any one of the following shapes: square, diamond, parallelogram, triangle, rectangle, pentagon, hexagon, octagon, or other concave/convex regular or irregular polygon.

To avoid unnecessary obfuscation of the descriptions of pixel circuits and circuit topologies that can be used in conjunction with the image sensor structures provided with the vertical transfer gates and nested sub-pixels described in conjunction with at least FIGS. 6 and 7, it may be assumed that only a single photosensitive region 684 is formed in the outer sub-pixel group. However, multiple photosensitive regions (such as regions 684-1 and 684-2) may be formed in the outer sub-pixel group without departing from the scope of the present embodiments.

Figure 8:
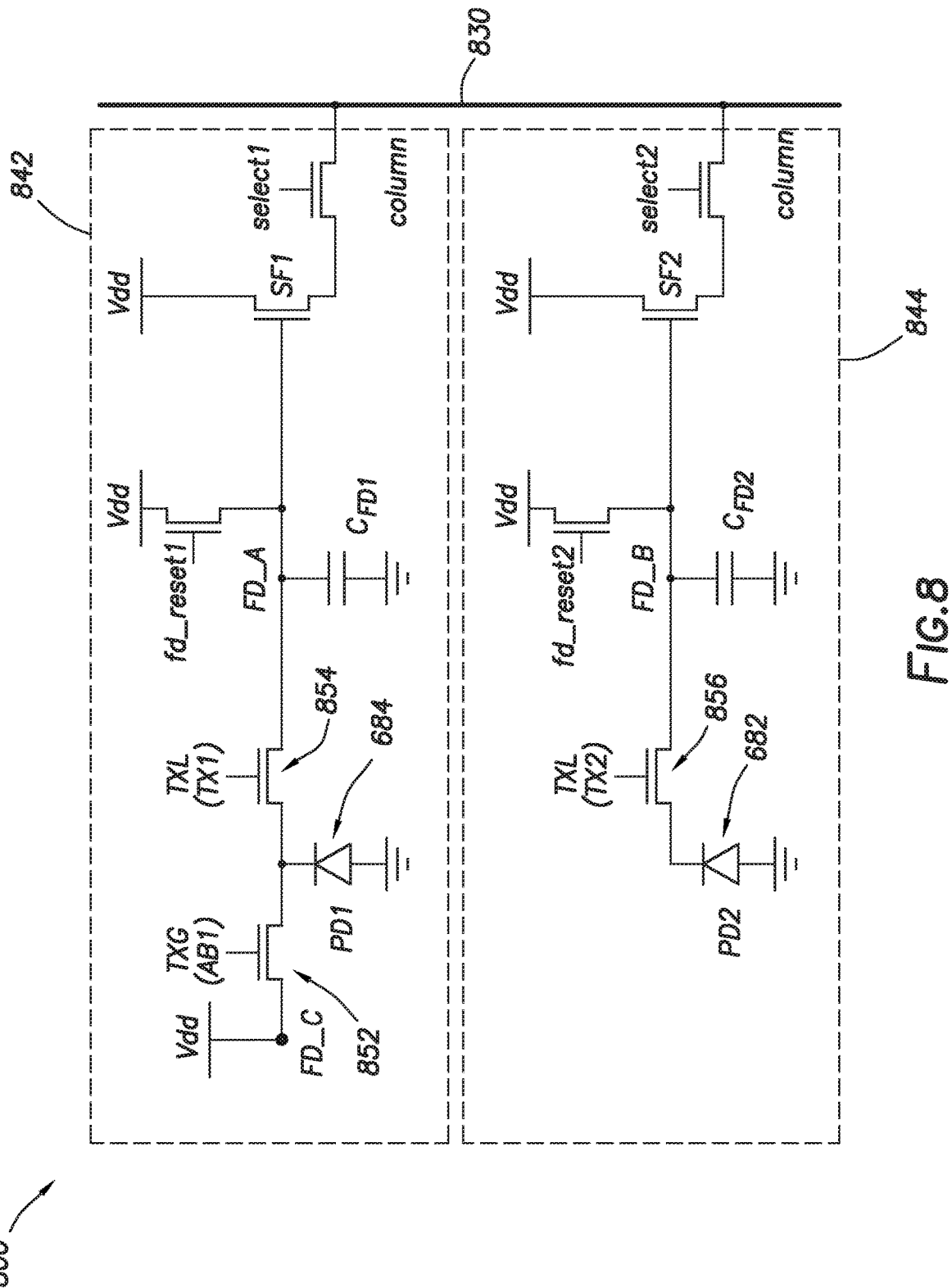
FIG. 8 shows an illustrative pixel circuit with independent charge transfer paths for a multi-photodiode image pixel utilizing vertical transfer gates, in accordance with an embodiment.

FIG. 8 shows an illustrative pixel circuit with independent charge transfer paths for a multi-photodiode image pixel utilizing vertical transfer gates in accordance with an embodiment. Photodiodes PD1 and PD2, which can respectively be drawn to photosensitive regions 684 and 682 of FIG. 6, respectively. The pixel circuit 800 may include a sub-circuit 842 for transferring and reading out charges from the PD1 photodiode and may further include a sub-circuit 844 for transferring and reading out charges from the PD2 photodiode. The sub-circuit 842 may be provided with an anti-blooming transistor 852 that may be controlled using the TXG control signal (but is sometimes referred to as an anti-blooming signal AB).

As described above in connection with FIGS. 6 and 7, the global vertical transfer gate 610-1 is formed in a grid or matrix and is coupled to all of the pixels in the grid. Therefore, when the TXG control signal applied to the global vertical transfer gate 610-1 is asserted, a positive bias may be applied to the vertical transfer gate structure 610-1 and thereby cause charges to be removed from an outer photodiode region 684 (PD1) and transferred to floating diffusion region 624-2 (FD_C) for each pixel. To achieve the circuit topology described in FIG. 8, the floating diffusion region 624-2 (FD_C) for each pixel may be tied to a positive supply voltage Vdd. Charges routed from the outer photodiode 682 (PD1) to the floating diffusion region 624-2 (FD_C) for a given pixel (due to the assertion of the TXG control signal applied to the global vertical transfer gate structure 610-1) will be drained to the power supply Vdd (which is coupled to the FD_C node, in such an embodiment).

The sub-circuits 842 and 844 may include transfer transistors 854 and 856 to move charges from the photodiodes 684 and 682 to a respective floating diffusion node (represented as the capacitors Cfd1 and Cfd2 in the sub-circuits 682 and 684, respectively). The transfer transistors 854 and 856 may represent/model the vertical charge transfer structure 610-2. Asserting the TXL control signal (sometimes referred to as the TX1 control signal in connection with the movement of charges from the PD1 photodiode 684) may cause charges from the PD1 photodiode 684 to be routed to the FD_A floating diffusion node 624-1 (represented as the Cfd1 capacitor in FIG. 8). Asserting the TXL control signal (sometimes referred to as the TX2 control signal in connection with the movement of charges from the PD2 photodiode 682) may cause charges from the PD2 photodiode 682 to be routed to the FD_B floating diffusion node 622 (represented as the Cfd2 capacitor in FIG. 8).

Source follower transistors SF1 and SF2 may be respectively coupled to the FD_A and FD_B floating diffusion nodes 624_1 and 622. Charges from the FD_A and FD_B floating diffusion nodes 624_1 and 622 may be read out by asserting the select 1 and/or select2 signals. Asserting the select1 signal provided to the gate terminal of a row select transistor may cause a signal (output at a drain terminal of the SF1 transistor) proportional to the charge stored in the FD_A floating diffusion node 624-1 to be output onto the column line 830. Asserting the select2 signal provided to the gate terminal of a row select transistor may cause a signal (output at a drain terminal of the SF1 transistor) proportional to the charge stored in the FD_A floating diffusion node 624-1 to be output onto the column line 830.

In this way, vertical transfer gates such as the global vertical transfer gate 610-1 (formed in a grid shared by and coupled to the outer PD1 photodiodes 684 in each of the pixels in an array of pixels) and the local vertical transfer gate 610-2 (formed individually for each pixel in the array of pixels, laterally surrounding the inner PD2 photodiode 682 in each respective pixel) may be used to serve as transistors in a pixel circuit. The global vertical transfer gate 610-1 may be used to form, or serve as, an anti-blooming transistor such as the transistor 852 and may drain excess charges from the PD1 photodiodes 684 of all of the pixels in an array of pixels when the TXG signal applied to global vertical transfer gate 610-1 is asserted to the FD-C floating diffusion node 624-2, which as shown in FIG. 8, may be electrically connected to a positive supply/source voltage Vdd terminal. The local vertical transfer gate 610-2 may be used to form, or serve as, a transfer transistor for both the PD1 photodiode 684 and the PD2 photodiode 682.

Assertion of the TXL signal provided to the local vertical transfer gate structure 610-2 for a given pixel may result in charges accumulated in/by the PD1 photodiode 684 being routed/transferred to the FD_A floating diffusion node 624-1. Assertion of the TXL signal provided to the local vertical transfer gate structure 610-2 for a given pixel may also result in charges accumulated in/by the PD2 photodiode 682 to be transferred to the FD_B floating diffusion node 622. Assertion of the TXL control signal may, in this way, simultaneously transfer charges from the PD1 and PD2 photodiodes to the FD_A and FD_B floating diffusion nodes using local vertical transfer gate 610-2.

Figure 9:
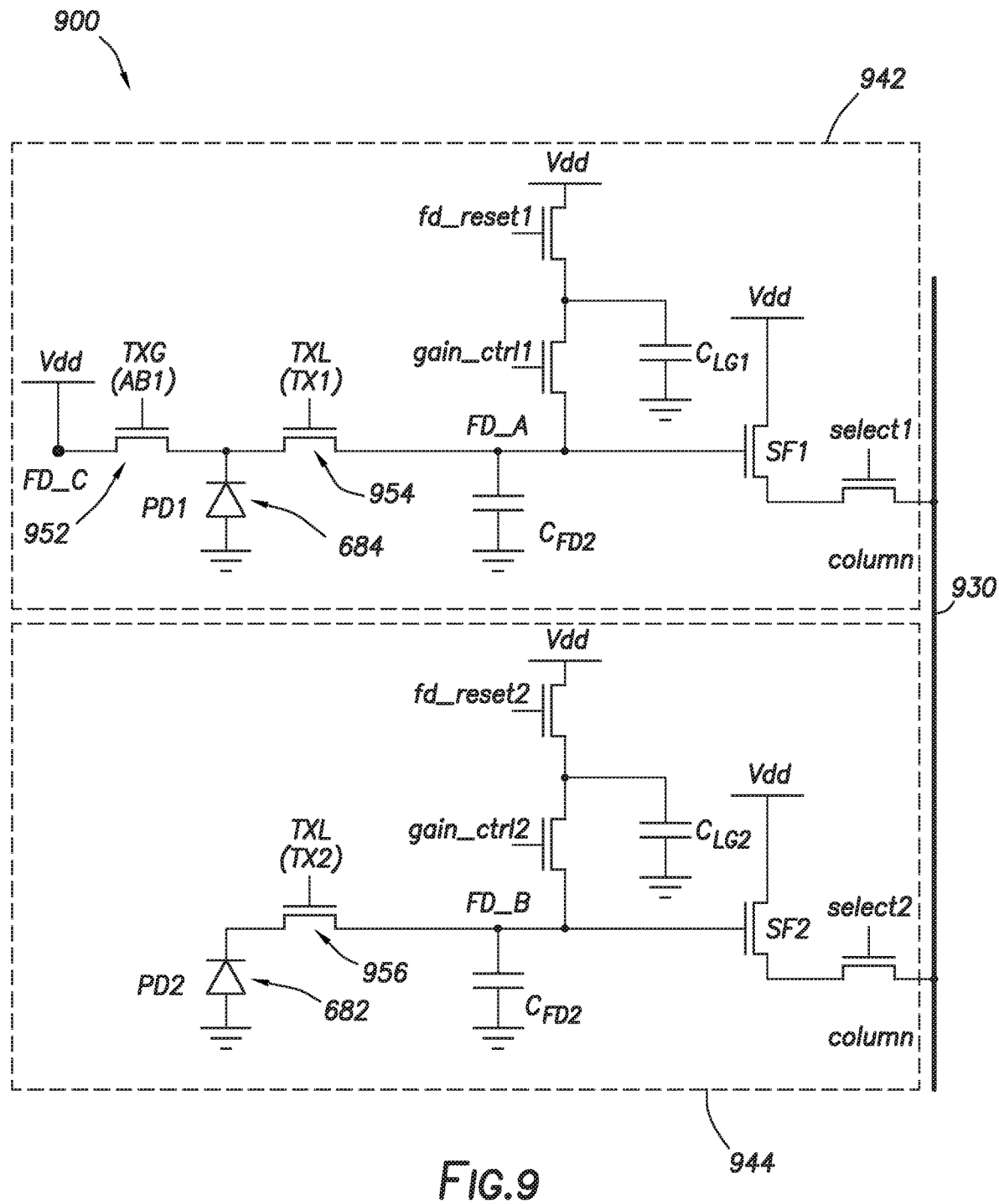
FIG. 9 shows an illustrative pixel circuit with independent charge transfer paths and capacitive nodes for each photodiode in a multi-photodiode image pixel, in accordance with an embodiment.

FIG. 9 shows an illustrative pixel circuit with independent charge transfer paths and capacitive nodes for each photodiode in a multi-photodiode image pixel. Similar to the pixel circuit shown in FIG. 8, the anti-blooming transistor 952 may be formed from the global vertical transfer gate structure 610-1 that is provided the TXG control signal. The transfer transistors 954 and 956 may correspond to the local vertical transfer gate structure 610-2 that is provided the TXL control signal.

When the TXG control signal applied to the global vertical transfer gate 610-1 is asserted, a positive bias may be applied to the vertical transfer gate structure 610-1 and thereby cause charges to be removed from an outer photodiode region 684 (PD1) and transferred to floating diffusion region 624-2 (FD_C) for each pixel. To achieve the circuit topology described in FIG. 9, the floating diffusion region 624-2 (FD_C) for each pixel may be tied to a positive supply voltage Vdd. Charges routed from the outer photodiode 682 (PD1) to the floating diffusion region 624-2 (FD_C) for a given pixel (due to the assertion of the TXG control signal applied to the global vertical transfer gate structure 610-1) will be drained to the power supply Vdd (which is coupled to the FD_C node, in such an embodiment).

The sub-circuits 942 and 944 may include transfer transistors 954 and 956 to move charges from the photodiodes 684 and 682 to a respective floating diffusion node (represented as the capacitors Cfd1 and Cfd2 in the sub-circuits 982 and 984, respectively). The transfer transistors 954 and 956 may represent/model the vertical charge transfer structure 610-2. Asserting the TXL control signal (sometimes referred to as the TX1 control signal in connection with the movement of charges from the PD1 photodiode 684) may cause charges from the PD1 photodiode 684 to be routed to the FD_A floating diffusion node 624-1 (represented as the Cfd1 capacitor in FIG. 9). Asserting the TXL control signal (sometimes referred to as the TX2 control signal in connection with the movement of charges from the PD2 photodiode 682) may cause charges from the PD2 photodiode 682 to be routed to the FD_B floating diffusion node 622 (represented as the Cfd2 capacitor in FIG. 8).

Source follower transistors SF1 and SF2 may be respectively coupled to the FD_A and FD_B floating diffusion nodes 624_1 and 622. Charges from the FD_A and FD_B floating diffusion nodes 624_1 and 622 may be read out by asserting the select1 and/or select2 signals. Asserting the select1 signal provided to the gate terminal of a row select transistor may cause a signal (output at a drain terminal of the SF1 transistor) proportional to the charge stored in the FD_A floating diffusion node 624-1 to be output onto the column line 930. Asserting the select2 signal provided to the gate terminal of a row select transistor may cause a signal (output at a drain terminal of the SF1 transistor) proportional to the charge stored in the FD_A floating diffusion node 624-1 to be output onto the column line 930.

In this way, vertical transfer gates such as the global vertical transfer gate 610-1 (formed in a grid shared by and coupled to the outer PD1 photodiodes 684 in each of the pixels in an array of pixels) and the local vertical transfer gate 610-2 (formed individually for each pixel in the array of pixels, laterally surrounding the inner PD2 photodiode 682 in each respective pixel) may be used to serve as transistors in a pixel circuit. The global vertical transfer gate 610-1 may be used to form, or serve as, an anti-blooming transistor such as the transistor 952 and may drain excess charges from the PD1 photodiodes 684 of all of the pixels in an array of pixels when the TXG signal applied to global vertical transfer gate 610-1 is asserted to the FD-C floating diffusion node 624-2, which as shown in FIG. 9, may be electrically connected to a positive supply/source voltage Vdd terminal. The local vertical transfer gate 610-2 may be used to form, or serve as, a transfer transistor for both the PD1 photodiode 684 and the PD2 photodiode 682.

Assertion of the TXL signal provided to the local vertical transfer gate structure 610-2 for a given pixel may result in charges accumulated in/by the PD1 photodiode 684 being routed/transferred to the FD_A floating diffusion node 624-1. Assertion of the TXL signal provided to the local vertical transfer gate structure 610-2 for a given pixel may also result in charges accumulated in/by the PD2 photodiode 682 to be transferred to the FD_B floating diffusion node 622. Assertion of the TXL control signal may, in this way, simultaneously transfer charges from the PD1 and PD2 photodiodes to the FD_A and FD_B floating diffusion nodes using local vertical transfer gate 610-2.

Pixel circuit 900 of FIG. 9 may differ from the circuit 800 of FIG. 8 in that a low gain capacitor $C_{LG1}$ may be coupled to the FD_A node through a first gain control transistor (controlled by the gain_ctrl1 control signal) in sub-circuit 942 and another low gain capacitor $C_{LG2}$ may be coupled to the FD_B node through a second gain control transistor (controlled by the gain_ctrl2 control signal) in sub-circuit 944.

Charges from a given photodiode PD1 or PD2 may be transferred to and stored on their associated floating diffusion nodes FD_A or FD_B, respectively. In some embodiments, charges from these photodiodes may be transferred to and stored on both their associated floating diffusion node and their associated low gain capacitor ($C_{LG1}$ for photodiode PD1, and $C_{LG2}$ for photodiode PD2). Transferring charges accumulated in a given one of the photodiodes may be stored/transferred to both the floating diffusion node associated with the given photodiode and the low gain capacitor associated with the given photodiode when the gain control signal associated with the given photodiode (gain_ctrl1 for PD1 and gain_ctrl2) is asserted, thereby opening a channel for charges to be shared between the given photodiode's floating diffusion node and low gain capacitor.

A first source follower transistor SF1 may produce an output at its drain terminal (or rather, at the column line 930) that is proportional to, or represents the amount of charge stored on the floating diffusion node FD_A. The output at the drain terminal 930 of the source follower transistor SF1 may also represent a charge on both the floating diffusion node FD_A and the capacitive node $C_{LG1}$, in the event that the GAIN_CTRL signal is asserted, opening the gain control transistor. To reset the charges on the capacitive nodes FD_A and $C_{LG1}$, a reset transistor may be opened by asserting the FD_RESET1 signal while the GAIN_CTRL1 signal is also asserted.

The pixel circuits 800 and 900 of FIGS. 8 and 9 include duplicated readout paths and circuits for each of the photodiodes PD1 and PD2. As an example, the sub-circuit 842 of circuit 800 may have a similar circuit configuration or circuit topology to the sub-circuit 844 of circuit 800 (with the exception of an anti-blooming transistor structure 852 being provided for PD1 in the sub-circuit 842). However, the duplication of circuit elements and readout paths may unnecessarily increase the complexity and number of total transistors used to read out an array of nested sub-pixels.

Figure 10:
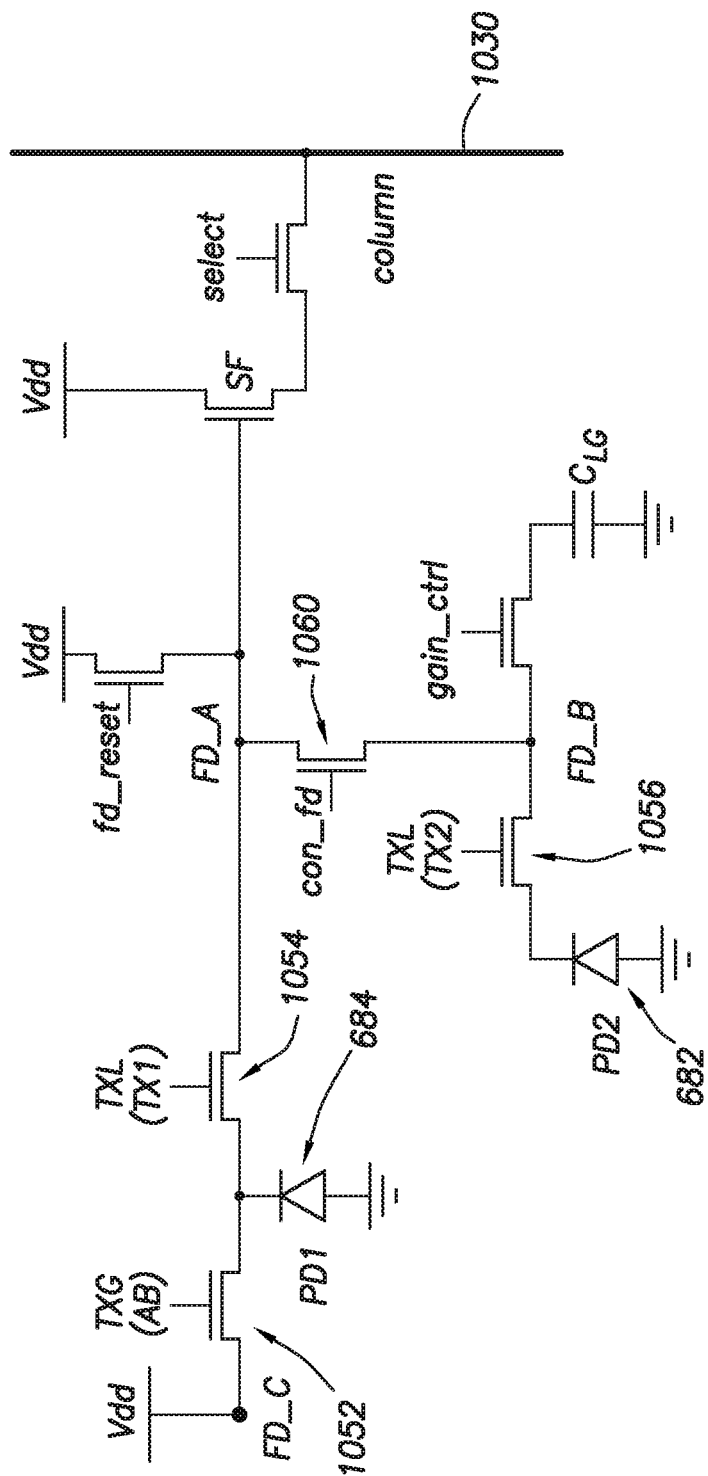
FIG. 10 shows an illustrative pixel circuit with a shared readout path and a low gain capacitor that enables a dual gain readout of an inner photodiode in a multi-photodiode image pixel, in accordance with an embodiment.

FIG. 10 shows an illustrative pixel circuit with a shared readout path and a low gain capacitor that enables a dual gain readout of an inner photodiode in a multi-photodiode image pixel. Similar to the pixel circuit shown in FIG. 8, the anti-blooming transistor 1052 may be formed from the global vertical transfer gate structure 610-1 that is provided the TXG control signal. The transfer transistors 1054 and 1056 may correspond to the local vertical transfer gate structure 610-2 that is provided the TXL control signal.

When the TXG control signal applied to the global vertical transfer gate 610-1 is asserted, a positive bias may be applied to the vertical transfer gate structure 610-1 and thereby cause charges to be removed from an outer photodiode region 684 (PD1) and transferred to floating diffusion region 624-2 (FD_C) for each pixel. To achieve the circuit topology described in FIG. 10, the floating diffusion region 624-2 (FD_C) for each pixel may be tied to a positive supply voltage Vdd. Charges routed from the outer photodiode 682 (PD1) to the floating diffusion region 624-2 (FD_C) for a given pixel (due to the assertion of the TXG control signal applied to the global vertical transfer gate structure 610-1) will be drained to the power supply Vdd (which is coupled to the FD_C node, in such an embodiment).

The pixel circuit 1000 may include transfer transistors 1054 and 1056 to move charges from the photodiodes 684 and 682 to a respective floating diffusion node. The transfer transistors 1054 and 1056 may represent/model the vertical charge transfer structure 610-2. Asserting the TXL control signal (sometimes referred to as the TX1 control signal in connection with the movement of charges from the PD1 photodiode 684) may cause charges from the PD1 photodiode 684 to be routed to the FD_A floating diffusion node 624-1. Asserting the TXL control signal (sometimes referred to as the TX2 control signal in connection with the movement of charges from the PD2 photodiode 682) may cause charges from the PD2 photodiode 682 to be routed to the FD_B floating diffusion node 622.

Source follower transistor SF may be coupled to the FD_A floating diffusion nodes 624_1 as well as the FD_B floating diffusion node 622 (through the connecting transistor 1060 that is controlled using the con_fd control signal). When the pixel circuit 1000 is operated, two reset values may first be sampled. A first reset value may be measured/sampled when the connecting transistor 1060 is turned off (i.e., the con_fd control signal is deasserted) and the FD_A floating diffusion node has been reset through the assertion of the fd_reset signal. A second reset value may be measured/sampled when the connecting transistor 1060 is turned on (i.e, the con_fd control signal is asserted) and the FD_B floating diffusion node has been reset through the assertion of both the fd_reset signal and the con_fd signal.

Because a single TXL signal is provided to both of the transfer transistors 1054 and 1056, charges from the PD1 and PD2 photodiodes are respectively transferred to the FD_A and FD_B nodes simultaneously. The charges transferred to the FD_A node from PD1 may first be read out by asserting the select control signal provided to the row select transistor coupled to the column line 1030. Then, the FD_A node may be reset through the assertion of the fd_reset signal.

The con_fd control signal provided to connecting transistor 1060 may then be asserted, thereby coupling the FD_B floating diffusion node to the FD_A floating diffusion node and the gate of the source follower transistor SF. However, the intervening connecting transistor 1060 in the read path for PD2 may result in higher read noise when reading out the charges stored on the FD_B floating diffusion node. During a charge accumulation period (sometimes referred to as an "integration time") for PD2, a portion of the accumulated charges may be routed to the $C_{LG}$ capacitor. These charges stored in the $C_{LG}$ capacitor may be read out in conjunction with the charges transferred from the PD2 photodiode to the FD_B floating diffusion node when the gain_ctrl control signal is asserted.

In this way, vertical transfer gates such as the global vertical transfer gate 610-1 (formed in a grid shared by and coupled to the outer PD1 photodiodes 684 in each of the pixels in an array of pixels) and the local vertical transfer gate 610-2 (formed individually for each pixel in the array of pixels, laterally surrounding the inner PD2 photodiode 682 in each respective pixel) may be used to serve as transistors in a pixel circuit. The global vertical transfer gate 610-1 may be used to form, or serve as, an anti-blooming transistor such as the transistor 1052 and may drain excess charges from the PD1 photodiodes 684 of all of the pixels in an array of pixels when the TXG signal applied to global vertical transfer gate 610-1 is asserted to the FD-C floating diffusion node 624-2, which as shown in FIG. 10, may be electrically connected to a positive supply/source voltage Vdd terminal. The local vertical transfer gate 610-2 may be used to form, or serve as, a transfer transistor for both the PD1 photodiode 684 and the PD2 photodiode 682.

Assertion of the TXL signal provided to the local vertical transfer gate structure 610-2 for a given pixel may result in charges accumulated in/by the PD1 photodiode 684 being routed/transferred to the FD_A floating diffusion node 624-1. Assertion of the TXL signal provided to the local vertical transfer gate structure 610-2 for a given pixel may also result in charges accumulated in/by the PD2 photodiode 682 to be transferred to the FD_B floating diffusion node 622. Assertion of the TXL control signal may, in this way, simultaneously transfer charges from the PD1 and PD2 photodiodes to the FD_A and FD_B floating diffusion nodes using local vertical transfer gate 610-2.

Figure 11:
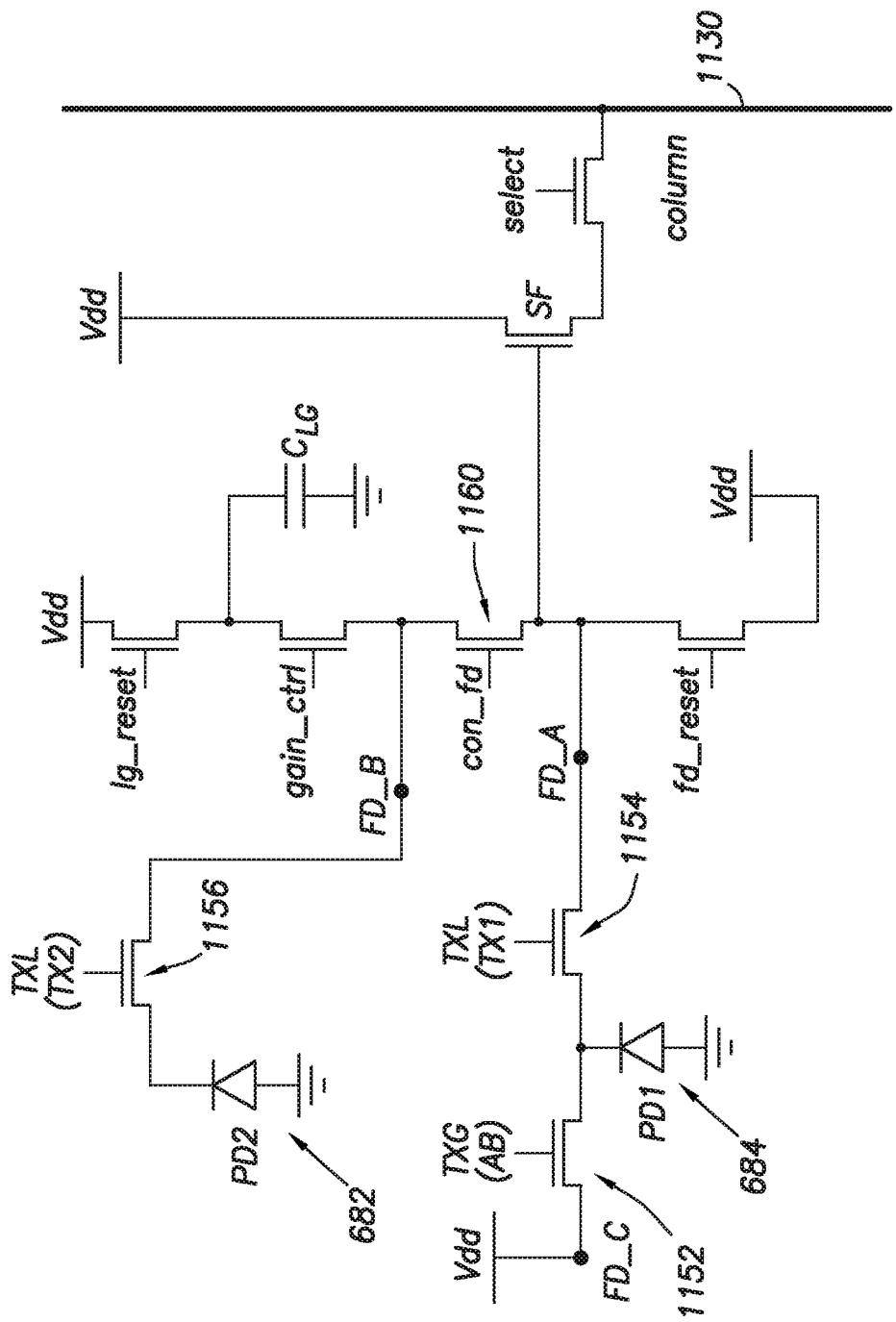
FIG. 11 shows an illustrative pixel circuit with a shared readout path and a low gain capacitor that enables a dual gain readout of an inner photodiode in a multi-photodiode image pixel and that can be directly reset, in accordance with an embodiment.

FIG. 11 shows an illustrative pixel circuit with a shared readout path and a low gain capacitor that enables a dual gain readout of an inner photodiode in a multi-photodiode image pixel and that can be directly reset. Similar to the pixel circuit shown in FIG. 10, the anti-blooming transistor 1152 may be formed from the global vertical transfer gate structure 610-1 that is provided the TXG control signal. The transfer transistors 1154 and 1156 may correspond to the local vertical transfer gate structure 610-2 that is provided the TXL control signal.

When the TXG control signal applied to the global vertical transfer gate 610-1 is asserted, a positive bias may be applied to the vertical transfer gate structure 610-1 and thereby cause charges to be removed from an outer photodiode region 684 (PD1) and transferred to floating diffusion region 624-2 (FD_C) for each pixel. To achieve the circuit topology described in FIG. 11, the floating diffusion region 624-2 (FD_C) for each pixel may be tied to a positive supply voltage Vdd. Charges routed from the outer photodiode 682 (PD1) to the floating diffusion region 624-2 (FD_C) for a given pixel (due to the assertion of the TXG control signal applied to the global vertical transfer gate structure 610-1) will be drained to the power supply Vdd (which is coupled to the FD_C node, in such an embodiment).

The pixel circuit 1100 may include transfer transistors 1154 and 1156 to move charges from the photodiodes 684 and 682 to a respective floating diffusion node. The transfer transistors 1154 and 1156 may represent/model the vertical charge transfer structure 610-2. Asserting the TXL control signal (sometimes referred to as the TX1 control signal in connection with the movement of charges from the PD1 photodiode 684) may cause charges from the PD1 photodiode 684 to be routed to the FD_A floating diffusion node 624-1. Asserting the TXL control signal (sometimes referred to as the TX2 control signal in connection with the movement of charges from the PD2 photodiode 682) may cause charges from the PD2 photodiode 682 to be routed to the FD_B floating diffusion node 622.

Source follower transistor SF may be coupled to the FD_A floating diffusion nodes 624_1 as well as the FD_B floating diffusion node 622 (through the connecting transistor 1160 that is controlled using the con_fd control signal). When the pixel circuit 1100 is operated, two reset values may first be sampled. A first reset value may be measured/sampled when the connecting transistor 1160 is turned off (i.e., the con_fd control signal is deasserted) and the FD_A floating diffusion node has been reset through the assertion of the fd_reset signal. A second reset value may be measured/sampled when the connecting transistor 1060 is turned on (i.e, the con_fd control signal is asserted) and the FD_B floating diffusion node has been reset through the assertion of both the fd_reset signal and the con_fd signal. Alternatively, the FD_B floating diffusion node may be reset through the assertion of the gain_ctrl and lg_reset signals. When the FD_B floating diffusion node is reset in this way, the $C_LG$ capacitor may also be reset. The $C_LG$ capacitor can be independently reset in the pixel circuit 1100 (through assertion of the lg_reset control signal), in contrast to the $C_LG$ capacitor in the pixel 1000 where the $C_LG$ capacitor must be reset along with the FD_B floating diffusion node through assertion of the gain_ctrl, con_fd, and fd_reset signals.

Because a single TXL signal is provided to both of the transfer transistors 1154 and 1156, charges from the PD1 and PD2 photodiodes are respectively transferred to the FD_A and FD_B nodes simultaneously. The charges transferred to the FD_A node from PD1 may first be read out by asserting the select control signal provided to the row select transistor coupled to the column line 1130. Then, the FD_A node may be reset through the assertion of the fd_reset signal.

The con_fd control signal provided to connecting transistor 1160 may then be asserted, thereby coupling the FD_B floating diffusion node to the FD_A floating diffusion node and the gate of the source follower transistor SF. However, the intervening connecting transistor 1160 in the read path for PD2 may result in higher read noise when reading out the charges stored on the FD_B floating diffusion node. During a charge accumulation period (sometimes referred to as an "integration time") for PD2, a portion of the accumulated charges may be routed to the $C_LG$ capacitor by asserting the gain_ctrl signal. These charges stored in the $C_LG$ capacitor may be read out in conjunction with the charges transferred from the PD2 photodiode to the FD_B floating diffusion node when the gain_ctrl control signal is asserted.

In this way, vertical transfer gates such as the global vertical transfer gate 610-1 (formed in a grid shared by and coupled to the outer PD1 photodiodes 684 in each of the pixels in an array of pixels) and the local vertical transfer gate 610-2 (formed individually for each pixel in the array of pixels, laterally surrounding the inner PD2 photodiode 682 in each respective pixel) may be used to serve as transistors in a pixel circuit. The global vertical transfer gate 610-1 may be used to form, or serve as, an anti-blooming transistor such as the transistor 1152 and may drain excess charges from the PD1 photodiodes 684 of all of the pixels in an array of pixels when the TXG signal applied to global vertical transfer gate 610-1 is asserted to the FD-C floating diffusion node 624-2, which as shown in FIG. 11, may be electrically connected to a positive supply/source voltage Vdd terminal. The local vertical transfer gate 610-2 may be used to form, or serve as, a transfer transistor for both the PD1 photodiode 684 and the PD2 photodiode 682.

Assertion of the TXL signal provided to the local vertical transfer gate structure 610-2 for a given pixel may result in charges accumulated in/by the PD1 photodiode 684 being routed/transferred to the FD_A floating diffusion node 624-1. Assertion of the TXL signal provided to the local vertical transfer gate structure 610-2 for a given pixel may also result in charges accumulated in/by the PD2 photodiode 682 to be transferred to the FD_B floating diffusion node 622. Assertion of the TXL control signal may, in this way, simultaneously transfer charges from the PD1 and PD2 photodiodes to the FD_A and FD_B floating diffusion nodes using local vertical transfer gate 610-2.

Figure 12:
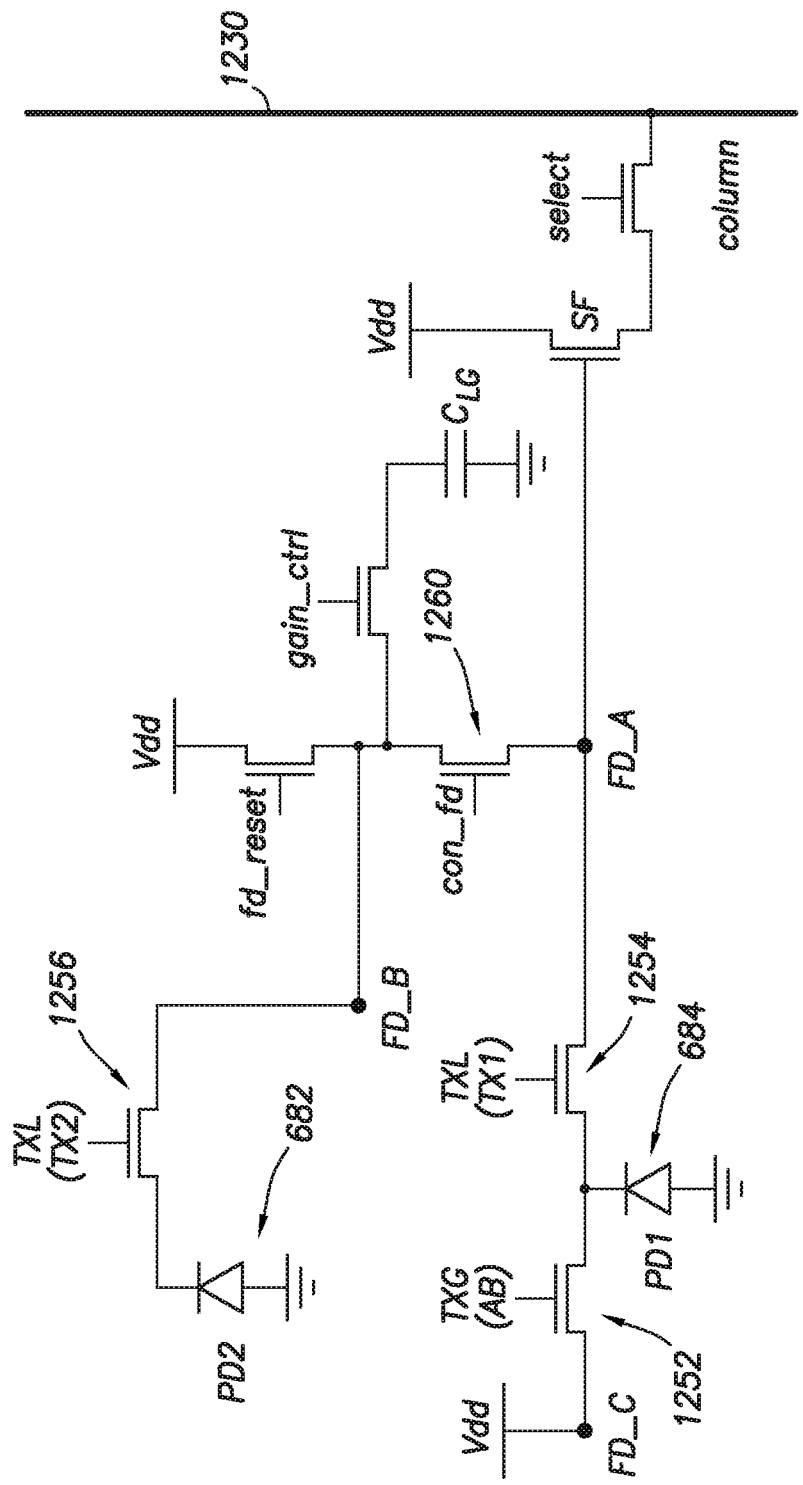
FIG. 12 shows an illustrative pixel circuit with independent charge transfer paths and capacitive nodes for each photodiode in a multi-photodiode image pixel, in accordance with an embodiment.

FIG. 12 shows an illustrative pixel circuit with independent charge transfer paths and capacitive nodes for each photodiode in a multi-photodiode image pixel. Similar to the pixel circuit shown in FIG. 11, the anti-blooming transistor 1252 may be formed from the global vertical transfer gate structure 610-1 that is provided the TXG control signal. The transfer transistors 1254 and 1256 may correspond to the local vertical transfer gate structure 610-2 that is provided the TXL control signal.

When the TXG control signal applied to the global vertical transfer gate 610-1 is asserted, a positive bias may be applied to the vertical transfer gate structure 610-1 and thereby cause charges to be removed from an outer photodiode region 684 (PD1) and transferred to floating diffusion region 624-2 (FD_C) for each pixel. To achieve the circuit topology described in FIG. 12, the floating diffusion region 624-2 (FD_C) for each pixel may be tied to a positive supply voltage Vdd. Charges routed from the outer photodiode 682 (PD1) to the floating diffusion region 624-2 (FD_C) for a given pixel (due to the assertion of the TXG control signal applied to the global vertical transfer gate structure 610-1) will be drained to the power supply Vdd (which is coupled to the FD_C node, in such an embodiment).

The pixel circuit 1200 may include transfer transistors 1254 and 1256 to move charges from the photodiodes 684 and 682 to a respective floating diffusion node. The transfer transistors 1254 and 1256 may represent/model the vertical charge transfer structure 610-2. Asserting the TXL control signal (sometimes referred to as the TX1 control signal in connection with the movement of charges from the PD1 photodiode 684) may cause charges from the PD1 photodiode 684 to be routed to the FD_A floating diffusion node 624-1. Asserting the TXL control signal (sometimes referred to as the TX2 control signal in connection with the movement of charges from the PD2 photodiode 682) may cause charges from the PD2 photodiode 682 to be routed to the FD_B floating diffusion node 622.

Source follower transistor SF may be coupled to the FD_A floating diffusion nodes 624_1 as well as the FD_B floating diffusion node 622 (through the connecting transistor 1160 that is controlled using the con_fd control signal). When the pixel circuit 1100 is operated, two reset values may first be sampled. A first reset value may be measured/sampled when the connecting transistor 1160 is turned off (i.e., the con_fd control signal is deasserted) and the FD_A floating diffusion node has been reset through the assertion of the fd_reset and con_fd signals. A second reset value may be measured/sampled when the connecting transistor 1160 is turned on (i.e, the con_fd control signal is asserted) and the FD_B floating diffusion node has been reset through the assertion of the fd_reset signal. The $C_LG$ capacitor can be reset in the pixel circuit 1100 (through assertion of the fd_reset and gain_ctrl control signals).

Because a single TXL signal is provided to both of the transfer transistors 1154 and 1156, charges from the PD1 and PD2 photodiodes are respectively transferred to the FD_A and FD_B nodes simultaneously. The charges transferred to the FD_A node from PD1 may first be read out by asserting the select control signal provided to the row select transistor coupled to the column line 1130.

In contrast to the embodiments of FIGS. 10 and 11, the FD_A floating diffusion node of FIG. 12 may be reset only when the FD_B floating diffusion node is also reset. Since the transfer of charges from the PD1 and PD2 photodiodes to the FD_A and FD_B floating diffusion nodes is done simultaneously, the FD_A node may not be reset after being read out.

Instead, the connecting transistor 1260 may be turned on (by asserting the con_fd control signal provided to the gate terminal of the transistor 1260) and a charge corresponding to the sum of the charges on the FD_A and FD_B floating diffusion nodes can be read out. When the con_fd control signal is asserted in this way, a signal corresponding to the sum of the charges stored on FD_A (from PD1) and FD_B (from PD2) may be read out. Finally, asserting both the gain_ctrl and con_fd signal may allow readout of a signal corresponding to the sum of the charges stored on FD_A (from PD1), FD_B (from PD2), and $C_LG$ (also from PD2).

In this way, vertical transfer gates such as the global vertical transfer gate 610-1 (formed in a grid shared by and coupled to the outer PD1 photodiodes 684 in each of the pixels in an array of pixels) and the local vertical transfer gate 610-2 (formed individually for each pixel in the array of pixels, laterally surrounding the inner PD2 photodiode 682 in each respective pixel) may be used to serve as transistors in a pixel circuit. The global vertical transfer gate 610-1 may be used to form, or serve as, an anti-blooming transistor such as the transistor 1252 and may drain excess charges from the PD1 photodiodes 684 of all of the pixels in an array of pixels when the TXG signal applied to global vertical transfer gate 610-1 is asserted to the FD-C floating diffusion node 624-2, which as shown in FIG. 12, may be electrically connected to a positive supply/source voltage Vdd terminal. The local vertical transfer gate 610-2 may be used to form, or serve as, a transfer transistor for both the PD1 photodiode 684 and the PD2 photodiode 682.

Assertion of the TXL signal provided to the local vertical transfer gate structure 610-2 for a given pixel may result in charges accumulated in/by the PD1 photodiode 684 being routed/transferred to the FD_A floating diffusion node 624-1. Assertion of the TXL signal provided to the local vertical transfer gate structure 610-2 for a given pixel may also result in charges accumulated in/by the PD2 photodiode 682 to be transferred to the FD_B floating diffusion node 622. Assertion of the TXL control signal may, in this way, simultaneously transfer charges from the PD1 and PD2 photodiodes to the FD_A and FD_B floating diffusion nodes using local vertical transfer gate 610-2.

Figure 13:
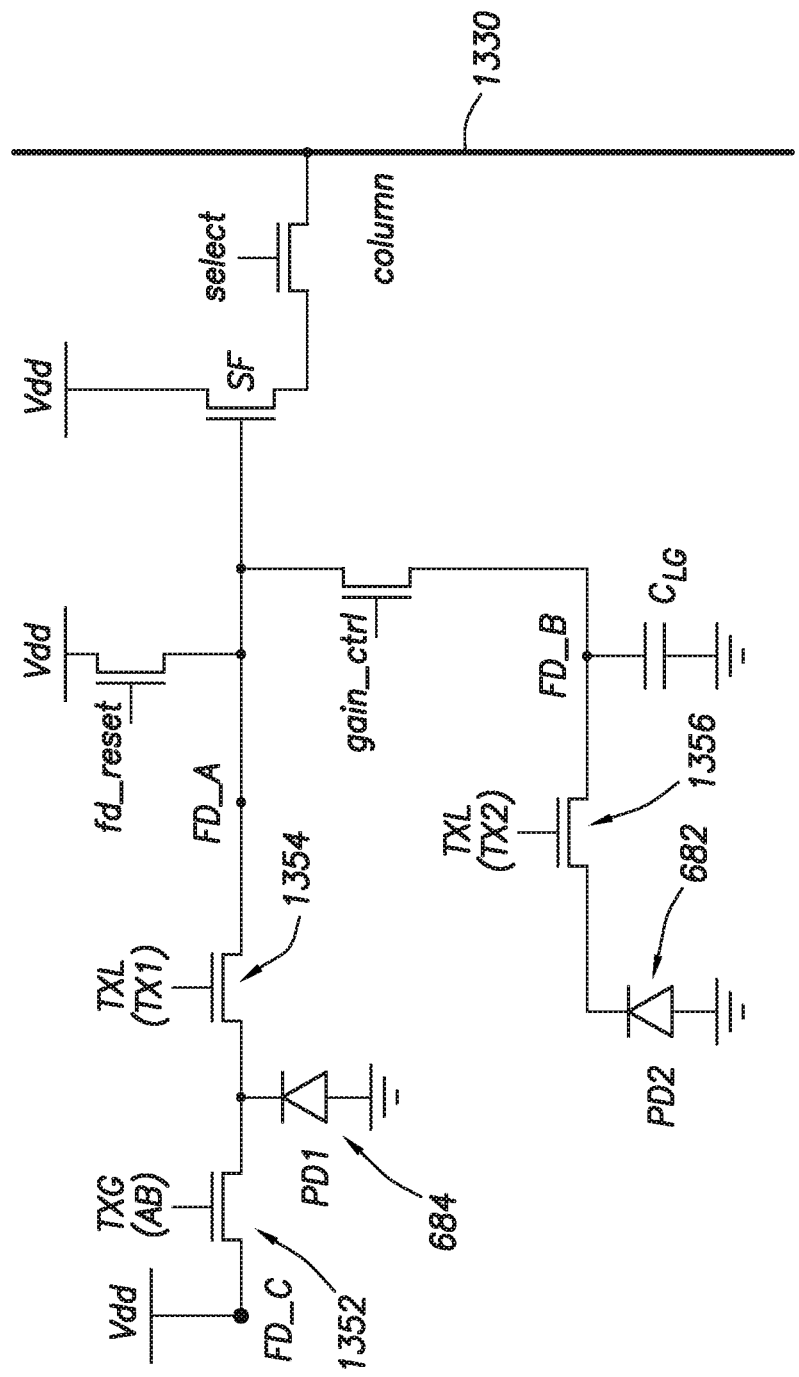
FIG. 13 shows an illustrative pixel circuit with a charge storage capacitor, in accordance with an embodiment.

FIG. 13 shows an illustrative pixel circuit with a charge storage capacitor. Similar to the pixel circuit shown in FIG. 12, the anti-blooming transistor 1352 may be formed from the global vertical transfer gate structure 610-1 that is provided the TXG control signal. The transfer transistors 1354 and 1356 may correspond to the local vertical transfer gate structure 610-2 that is provided the TXL control signal.

When the TXG control signal applied to the global vertical transfer gate 610-1 is asserted, a positive bias may be applied to the vertical transfer gate structure 610-1 and thereby cause charges to be removed from an outer photodiode region 684 (PD1) and transferred to floating diffusion region 624-2 (FD_C) for each pixel. To achieve the circuit topology described in FIG. 13, the floating diffusion region 624-2 (FD_C) for each pixel may be tied to a positive supply voltage Vdd. Charges routed from the outer photodiode 682 (PD1) to the floating diffusion region 624-2 (FD_C) for a given pixel (due to the assertion of the TXG control signal applied to the global vertical transfer gate structure 610-1) will be drained to the power supply Vdd (which is coupled to the FD_C node, in such an embodiment).

The pixel circuit 1300 may include transfer transistors 1354 and 1356 to move charges from the photodiodes 684 and 682 to a respective floating diffusion node. The transfer transistors 1354 and 1356 may represent/model the vertical charge transfer structure 610-2. Asserting the TXL control signal (sometimes referred to as the TX1 control signal in connection with the movement of charges from the PD1 photodiode 684) may cause charges from the PD1 photodiode 684 to be routed to the FD_A floating diffusion node 624-1. Asserting the TXL control signal (sometimes referred to as the TX2 control signal in connection with the movement of charges from the PD2 photodiode 682) may cause charges from the PD2 photodiode 682 to be routed to the FD_B floating diffusion node 622.

The $C_{LG}$ capacitor may be used to store overflow charges from the PD2 photodiode 682 or both the PD2 photodiode 682 and the PD1 photodiode 684. Overflow charges from the PD2 photodiode 682 may be stored in the $C_LG$ capacitor when the TXL signal provided to the transfer transistors 1354 and 1356 is asserted while the gain_ctrl control signal is deasserted. Overflow charges from the PD2 photodiode 682 and the PD1 photodiode 684 may be stored in the $C_LG$ capacitor when the TXL provided to the transfer transistors 1354 and 1356 is asserted while the gain_ctrl control signal is asserted.

In this way, vertical transfer gates such as the global vertical transfer gate 610-1 (formed in a grid shared by and coupled to the outer PD1 photodiodes 684 in each of the pixels in an array of pixels) and the local vertical transfer gate 610-2 (formed individually for each pixel in the array of pixels, laterally surrounding the inner PD2 photodiode 682 in each respective pixel) may be used to serve as transistors in a pixel circuit. The global vertical transfer gate 610-1 may be used to form, or serve as, an anti-blooming transistor such as the transistor 1352 and may drain excess charges from the PD1 photodiodes 684 of all of the pixels in an array of pixels when the TXG signal applied to global vertical transfer gate 610-1 is asserted to the FD-C floating diffusion node 624-2, which as shown in FIG. 13, may be electrically connected to a positive supply/source voltage Vdd terminal. The local vertical transfer gate 610-2 may be used to form, or serve as, a transfer transistor for both the PD1 photodiode 684 and the PD2 photodiode 682.

Assertion of the TXL signal provided to the local vertical transfer gate structure 610-2 for a given pixel may result in charges accumulated in/by the PD1 photodiode 684 being routed/transferred to the FD_A floating diffusion node 624-1. Assertion of the TXL signal provided to the local vertical transfer gate structure 610-2 for a given pixel may also result in charges accumulated in/by the PD2 photodiode 682 to be transferred to the FD_B floating diffusion node 622. Assertion of the TXL control signal may, in this way, simultaneously transfer charges from the PD1 and PD2 photodiodes to the FD_A and FD_B floating diffusion nodes using local vertical transfer gate 610-2.

Figure 14A:
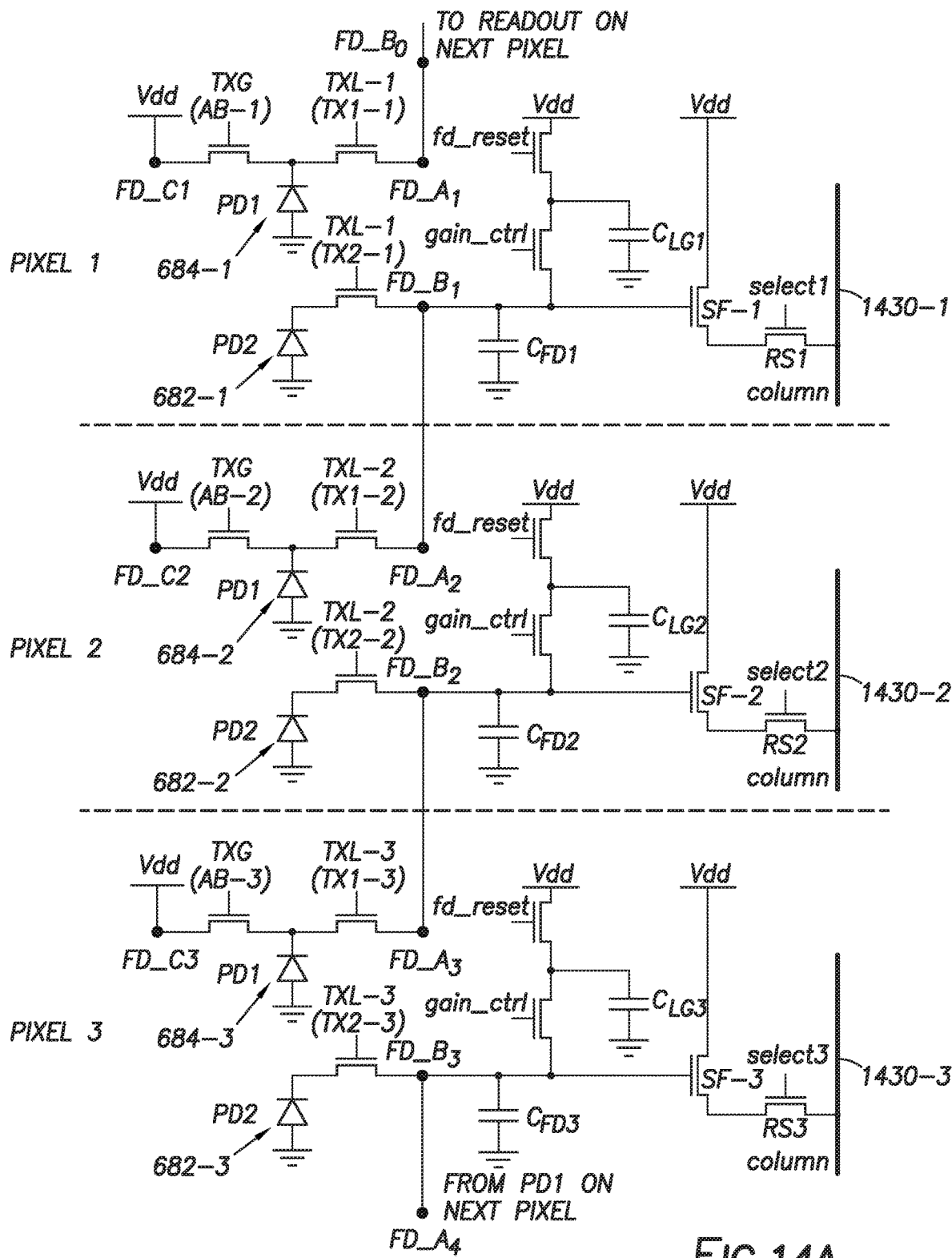
FIG. 14A illustrates multiple image pixel circuits with readout circuits that are used by outer photodiodes of neighboring image pixels, in accordance with an embodiment.

FIG. 14A illustrates multiple image pixel circuits with readout circuits that are used by neighboring image pixels to readout charges from their outer photodiodes. The PD1 photodiodes 684_1, 684_2, and 684_3 in pixels 1, 2, and 3, respectively are substantially similar to the photodiode PD1 photodiode 684 described in connection with FIGS. 6 and 7. The PD2 photodiodes 682_1, 682_2, and 682_3 in pixels 1, 2, and 3, respectively are substantially similar to the photodiode PD2 photodiode 682 described in connection with FIGS. 6 and 7. The PD1 photodiodes in pixels 1, 2, and 3 may be respectively coupled to floating diffusion nodes FD_A1, FD_A2, and FD_A3, which are floating diffusion nodes similar to the FD_A floating diffusion node 624-1 in FIGS. 6 and 7. The PD1 photodiodes in pixels 1, 2, and 3 may be respectively coupled to floating diffusion nodes FD_A1, FD_A2, and FD_A3 through local vertical transfer gate structures 610-2 in their respective pixels, represented by a transistor in FIG. 14A, controlled by TXL control signals such as TXL_1 (for pixel 1), TXL_2 (for pixel 2), and TXL_3 (for pixel 3). The floating diffusion node FD_A4 may be coupled to the PD1 photodiode in a pixel that neighbors or is adjacent to pixel 3 (not pictured).

The PD2 photodiodes in pixels 1, 2, and 3 may be respectively coupled to floating diffusion nodes FD_B1, FD_B2, and FD_B3, which are floating diffusion nodes similar to the FD_B floating diffusion node 622 in FIGS. 6 and 7. PD2 photodiodes in pixels 1, 2, and 3 may be respectively coupled to floating diffusion nodes FD_B1, FD_B2, and FD_B3 through local vertical transfer gate structures 610-2 in their respective pixels, represented by a transistor in FIG. 14A, controlled by TXL control signals such as TXL_1 (for pixel 1), TXL_2 (for pixel 2), and TXL_3 (for pixel 3). The floating diffusion node FD_B0 may be coupled to the PD2 photodiode in a pixel that neighbors or is adjacent to pixel 1 (not pictured) and the readout circuitry associated with the neighboring/adjacent pixel.

The PD1 photodiodes in pixels 1, 2, and 3 may also be respectively coupled to floating diffusion nodes FD_C1, FD_C2, and FD_C3, which are floating diffusion nodes similar to the FD_C floating diffusion node 624-2 in FIGS. 6 and 7. The PD1 photodiodes in pixels 1, 2, and 3 may be respectively coupled to floating diffusion nodes FD_C1, FD_C2, and FD_C3 through global vertical transfer gate structure 610-1 that is disposed throughout the array, represented by a transistor in FIG. 14A, controlled by the TXG control signal. The FD_C1, FD_C2, and FD_C3 floating diffusion nodes may be electrically coupled to a positive Vdd power supply voltage so that upon the assertion of the TXG signal (applied to all pixels, as the global vertical transfer gate structure 610-1 is coupled to every pixel in an array of image pixels), the charges from the PD1 photodiodes are drained or reset, in every pixel of the array.

The pixel circuits may be coupled to column lines 1430_1, 1430_2, and 1430_3. The column lines 1430_1, 1430_2, and 1430_3 may be the same column line (e.g., if pixels 1, 2 and 3 are pixels in a common column) or may be distinct/different column lines (e.g., if pixels 1, 2, and 3 are pixels in different columns). Generally, pixels 1, 2, and 3 may be adjacent pixels (i.e., vertically adjacent or horizontally adjacent).

Figure 15A:
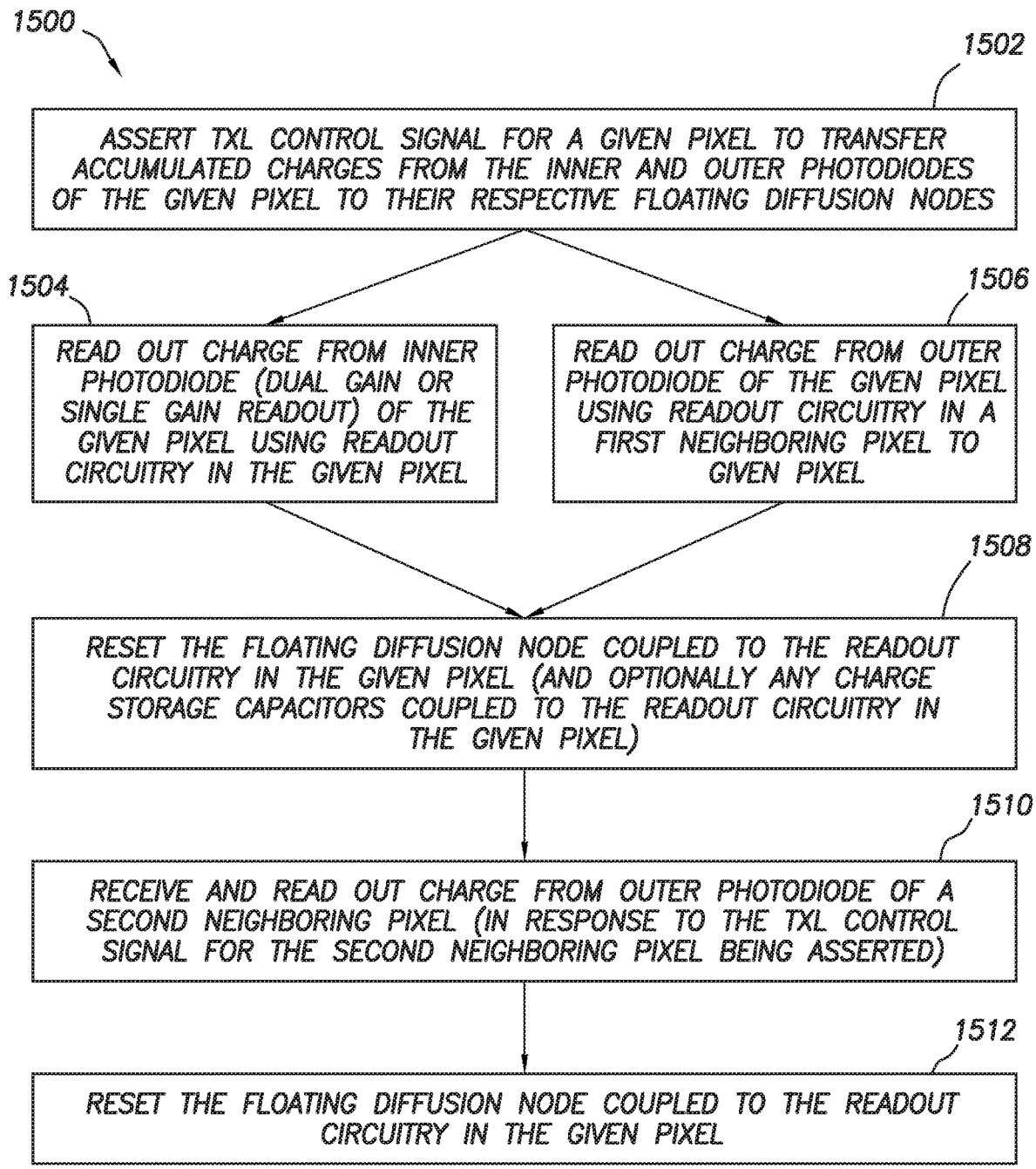
FIG. 15A is an illustrative method for operating the image pixel circuits shown in FIG. 14A, in accordance with an embodiment.

FIG. 15A is an illustrative method for operating the image pixel circuits shown in FIG. 14A. At step 1502 of method 1500, the TXL control signal for a given pixel (such as pixel 2, for the purposes of illustration) may be asserted to transfer accumulated charges from the inner and outer photodiodes of the given pixel to their respective floating diffusion nodes. If the given pixel is pixel 2 of FIG. 14A, for example, the TXL_2 control signal may be asserted at step 1502 to transfer accumulated charges from the PD1 photodiode to the FD_A2 floating diffusion node and to transfer accumulated charges from the PD2 photodiode to the FD_B2 floating diffusion node (also represented as the capacitor Cfd2 in FIG. 14A). As the charges are transferred out of the PD1 and PD2 photodiodes, another integration period may commence and additional charges may be accumulated in the photodiodes.

Steps 1504 and 1506 may both occur simultaneously after step 1502. The charges transferred out of the PD1 and PD2 photodiodes in the given pixel to the FD_A2 and FD_B2 floating diffusion nodes in step 1502 may be read out in steps 1504 and 1506. At step 1504, charges from the inner photodiode PD2 for a given pixel (such as the PD2 photodiode 682_2, when the given pixel is pixel 2) that were transferred to their associated floating diffusion node (the FD_B2 node in the example of pixel 2) may be read out using the readout circuitry (such as the SF_2 source follower transistor and the RS2 row select transistor in pixel 2) coupled to the column line of that given pixel. The readout of the PD2 photodiode charges may be a dual gain or a single gain readout. In a dual gain readout of the PD2 photodiode charges for a given pixel, a first readout may be performed after the assertion of the TXL signal for the pixel has been asserted and the charges are moved to the FD_B node for the given pixel. Readout may be performed by asserting the select signal provided to the row select transistor in a pixel's readout circuitry (such as the select2 signal for the RS2 transistor in pixel 2).

Then, to perform a second readout in the dual gain readout, the gain_ctrl control signal for the given pixel may be asserted and charges from both the Clg transistor in the pixel (such as Clg2 for pixel 2) and the FD_B node for the given pixel (such as FD_B2 for pixel 2) may be read out (by asserting the select2 signal after the gain_ctrl signal has been asserted). In a single gain readout of the PD2 photodiode, a single one of the first and second readouts described above in connection with the dual gain readout may be performed.

Because the assertion of the TXL control signal causes charges from both of the photodiodes PD1 and PD2 within a given pixel to be transferred out, readout of these transferred charges cannot be performed using the same readout circuitry (as doing so would result in unwanted addition/admixture of the charges from the different photodiodes). So, while charges from the inner photodiode PD2 for a given pixel are read out using the readout circuitry in that given pixel, at step 1506, charges from the outer photodiode PD1 for a given pixel may be read out using readout circuitry in a first neighboring pixel. In the example where the given pixel is pixel 2, charges transferred from the PD1 photodiode 684_2 that were transferred to the FD_A2 node may be read out using the readout circuitry in pixel 1 (i.e., using the SF_1 source follower transistor and the RS1 row select transistor in pixel 1). Asserting the select1 signal provided to the RS1 row select transistor in pixel 1 after the charges from PD1 have been transferred to the FD_A2 floating diffusion node may result in a read out of the charges from the PD1 onto the column line 1430-1.

At step 1508, the floating diffusion node coupled to the readout circuitry in the given pixel (and optionally any charge storage capacitors coupled to the readout circuitry in the given pixel) may be reset. In the example where the given pixel is pixel 2, the FD_B2 node (that is coupled to the readout circuitry—the SF2 source follower transistor and the RS2 row select transistor) may be reset through the assertion of the gain_ctrl and fd_reset signals in pixel 2. The reset of the floating diffusion node coupled to the readout circuitry of pixel 2 may make the readout circuitry of pixel 2 available to read out charges from the outer PD1 photodiode of another pixel (just as the readout circuitry of pixel 1 was used to read out charges from the outer PD1 photodiode of pixel 2), such as pixel 3.

At step 1510, the readout circuitry of the given pixel may receive and read out charge from outer photodiode of a second neighboring pixel (in response to the TXL control signal for the second neighboring pixel being asserted). In the example where pixel 2 is the given pixel, the TXL signal in a second neighboring pixel such as pixel 3 (i.e., the TXL_3 signal) may be asserted and result in the charges from the outer PD1 photodiode 684_3 being read transferred to the FD_A3 floating diffusion node, which is coupled to the FD_B2 floating diffusion node and readout circuitry in pixel 2. Because the FD_B2 floating diffusion node was reset in step 1508, after transferring the charges from outer PD1 photodiode 684_3 to the FD_A3 floating diffusion node, asserting the select2 signal provided to the RS2 row select transistor may result in the charges from the outer PD1 photodiode 684_3 in pixel 3 being read out.

At step 1512, the floating diffusion node coupled to the readout circuitry in given pixel may be reset. In the example where pixel 2 is the given pixel, the FD_B2 floating diffusion node that is coupled to the readout circuitry of the SF_2 source follower transistor and the RS2 row select transistor may be reset. This may prepare pixel 2 for another iteration of the method 1500.

Figure 14B:
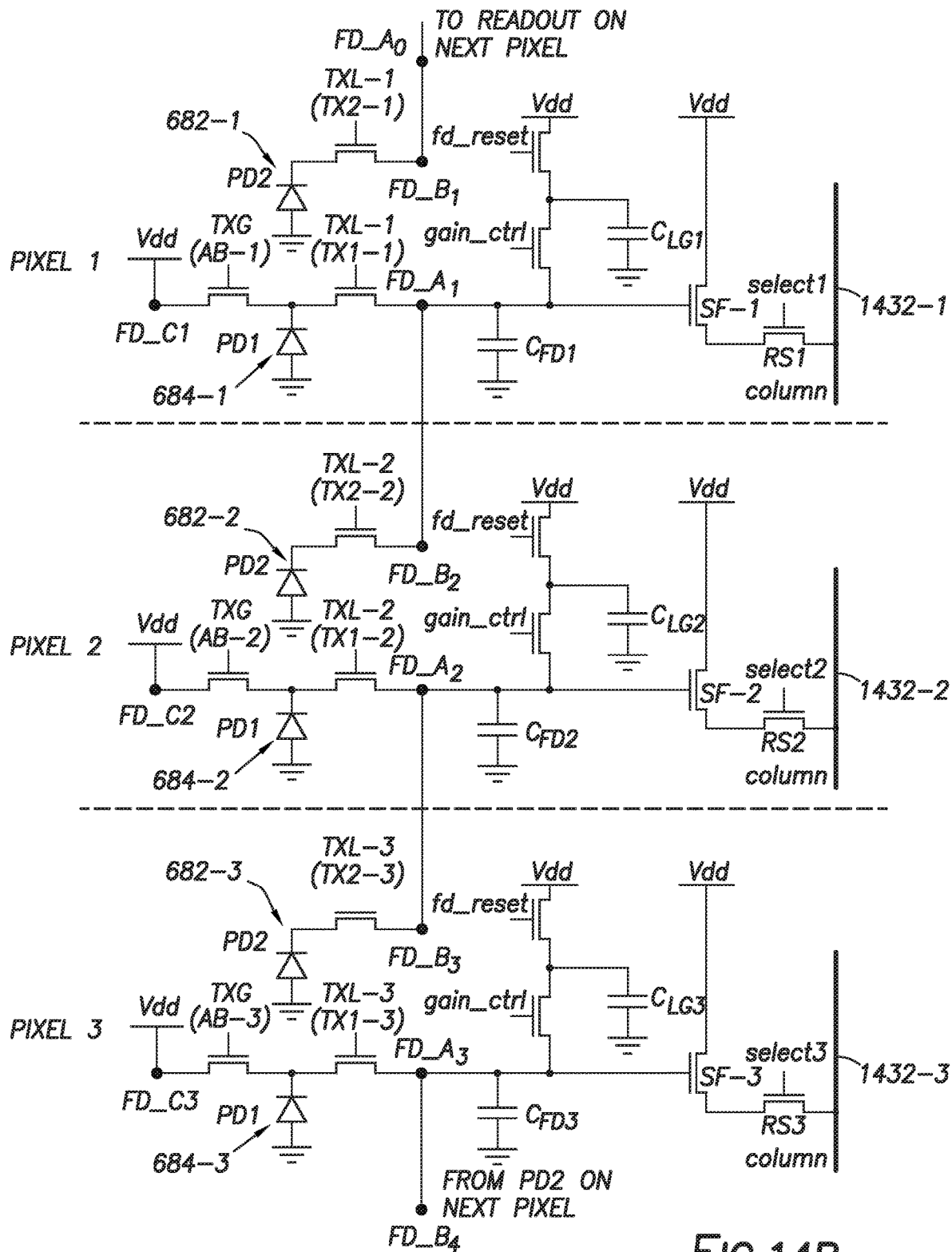
FIG. 14B illustrates multiple image pixel circuits with readout circuits that are used by inner photodiodes of neighboring image pixels, in accordance with an embodiment.

FIG. 14B illustrates multiple image pixel circuits with readout circuits that are used by neighboring image pixels to readout charges from their inner photodiodes. The PD1 photodiodes 684_1, 684_2, and 684_3 in pixels 1, 2, and 3, respectively are substantially similar to the photodiode PD1 photodiode 684 described in connection with FIGS. 6 and 7. The PD2 photodiodes 682_1, 682_2, and 682_3 in pixels 1, 2, and 3, respectively are substantially similar to the photodiode PD2 photodiode 682 described in connection with FIGS. 6 and 7. The PD1 photodiodes in pixels 1, 2, and 3 may be respectively coupled to floating diffusion nodes FD_A1, FD_A2, and FD_A3, which are floating diffusion nodes similar to the FD_A floating diffusion node 624-1 in FIGS. 6 and 7. The PD1 photodiodes in pixels 1, 2, and 3 may be respectively coupled to floating diffusion nodes FD_A1, FD_A2, and FD_A3 through local vertical transfer gate structures 610-2 in their respective pixels, represented by a transistor in FIG. 14B, controlled by TXL control signals such as TXL_1 (for pixel 1), TXL_2 (for pixel 2), and TXL_3 (for pixel 3). The floating diffusion node FD_A0 may be coupled to the readout circuitry in a pixel that neighbors or is adjacent to pixel 1 (not pictured).

The PD2 photodiodes in pixels 1, 2, and 3 may be respectively coupled to floating diffusion nodes FD_B1, FD_B2, and FD_B3, which are floating diffusion nodes similar to the FD_B floating diffusion node 622 in FIGS. 6 and 7. PD2 photodiodes in pixels 1, 2, and 3 may be respectively coupled to floating diffusion nodes FD_B1, FD_B2, and FD_B3 through local vertical transfer gate structures 610-2 in their respective pixels, represented by a transistor in FIG. 14B, controlled by TXL control signals such as TXL_1 (for pixel 1), TXL_2 (for pixel 2), and TXL_3 (for pixel 3). The floating diffusion node FD_B4 may be coupled to the PD2 photodiode in a pixel that neighbors or is adjacent to pixel 3 (not pictured).

The PD1 photodiodes in pixels 1, 2, and 3 may also be respectively coupled to floating diffusion nodes FD_C1, FD_C2, and FD_C3, which are floating diffusion nodes similar to the FD_C floating diffusion node 624-2 in FIGS. 6 and 7. The PD1 photodiodes in pixels 1, 2, and 3 may be respectively coupled to floating diffusion nodes FD_C1, FD_C2, and FD_C3 through global vertical transfer gate structure 610-1 that is disposed throughout the array, represented by a transistor in FIG. 14B, controlled by the TXG control signal. The FD_C1, FD_C2, and FD_C3 floating diffusion nodes may be electrically coupled to a positive Vdd power supply voltage so that upon the assertion of the TXG signal (applied to all pixels, as the global vertical transfer gate structure 610-1 is coupled to every pixel in an array of image pixels), the charges from the PD1 photodiodes are drained or reset, in every pixel of the array.

The pixel circuits may be coupled to column lines 1432_1, 1432_2, and 1432_3. The column lines 1432_1, 1432_2, and 1432_3 may be the same column line (e.g., if pixels 1, 2 and 3 are pixels in a common column) or may be distinct/different column lines (e.g., if pixels 1, 2, and 3 are pixels in different columns). Generally, pixels 1, 2, and 3 may be adjacent pixels (i.e., vertically adjacent or horizontally adjacent).

Figure 15B:
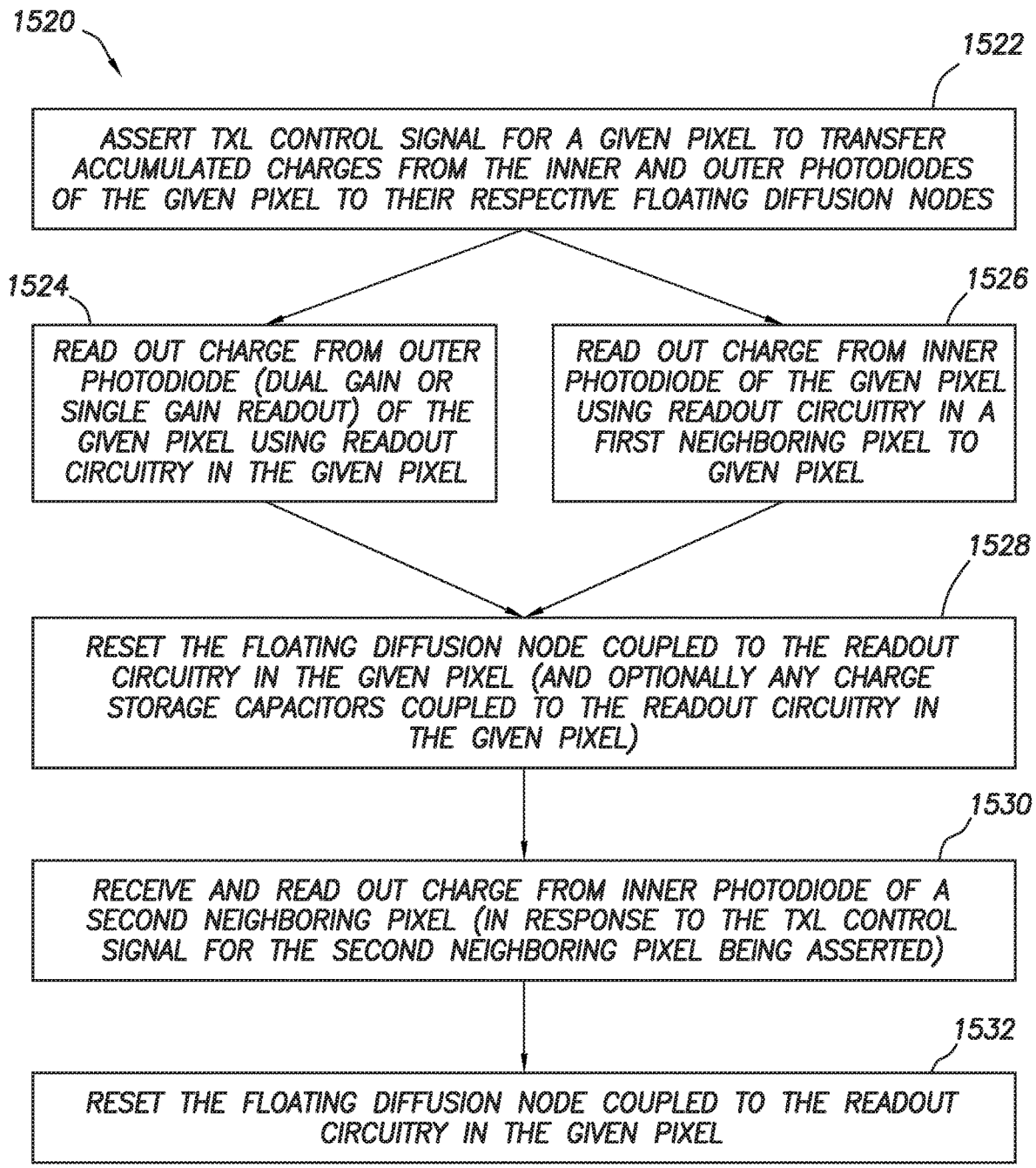
FIG. 15B is an illustrative method for operating the image pixel circuits shown in FIG. 14B, in accordance with an embodiment.

FIG. 15B is an illustrative method for operating the image pixel circuits shown in FIG. 14B. At step 1522 of method 1520, the TXL control signal for a given pixel (such as pixel 2, for the purposes of illustration) may be asserted to transfer accumulated charges from the inner and outer photodiodes of the given pixel to their respective floating diffusion nodes. If the given pixel is pixel 2 of FIG. 14B, for example, the TXL_2 control signal may be asserted at step 1522 to transfer accumulated charges from the PD1 photodiode to the FD_A2 floating diffusion node (also represented as the capacitor Cfd2 in FIG. 14B) and to transfer accumulated charges from the PD2 photodiode to the FD_B2 floating diffusion node. As the charges are transferred out of the PD1 and PD2 photodiodes, another integration period may commence and additional charges may be accumulated in the photodiodes.

Steps 1524 and 1526 may both occur simultaneously after step 1522. The charges transferred out of the PD1 and PD2 photodiodes in the given pixel to the FD_A2 and FD_B2 floating diffusion nodes in step 1522 may be read out in steps 1524 and 1526. At step 1524, charges from the outer photodiode PD1 for a given pixel (such as the PD1 photodiode 684_2, when the given pixel is pixel 2) that were transferred to their associated floating diffusion node (the FD_A2 node in the example of pixel 2) may be read out using the readout circuitry (such as the SF_2 source follower transistor and the RS2 row select transistor in pixel 2) coupled to the column line of that given pixel. The readout of the PD1 photodiode charges may be a dual gain or a single gain readout. In a dual gain readout of the PD1 photodiode charges for a given pixel, a first readout may be performed after the assertion of the TXL signal for the pixel has been asserted and the charges are moved to the FD_A node for the given pixel. Readout may be performed by asserting the select signal provided to the row select transistor in a pixel's readout circuitry (such as the select2 signal for the RS2 transistor in pixel 2).

Then, to perform a second readout in the dual gain readout, the gain_ctrl control signal for the given pixel may be asserted and charges from both the Clg transistor in the pixel (such as Clg2 for pixel 2) and the FD_A node for the given pixel (such as FD_A2 for pixel 2) may be read out (by asserting the select2 signal after the gain_ctrl signal has been asserted). In a single gain readout of the PD1 photodiode, a single one of the first and second readouts described above in connection with the dual gain readout may be performed.

Because the assertion of the TXL control signal causes charges from both of the photodiodes PD1 and PD2 within a given pixel to be transferred out, readout of these transferred charges cannot be performed using the same readout circuitry (as doing so would result in unwanted addition/admixture of the charges from the different photodiodes). So, while charges from the outer photodiode PD1 for a given pixel are read out using the readout circuitry in that given pixel, at step 1526, charges from the inner photodiode PD2 for a given pixel may be read out using readout circuitry in a first neighboring pixel. In the example where the given pixel is pixel 2, charges transferred from the PD2 photodiode 682_2 that were transferred to the FD_B2 node may be read out using the readout circuitry in pixel 1 (i.e., using the SF_1 source follower transistor and the RS1 row select transistor in pixel 1). Asserting the select1 signal provided to the RS1 row select transistor in pixel 1 after the charges from PD1 have been transferred to the FD_B2 floating diffusion node may result in a read out of the charges from the PD1 onto the column line 1432-1.

At step 1528, the floating diffusion node coupled to the readout circuitry in the given pixel (and optionally any charge storage capacitors coupled to the readout circuitry in the given pixel) may be reset. In the example where the given pixel is pixel 2, the FD_A2 node (that is coupled to the readout circuitry—the SF2 source follower transistor and the RS2 row select transistor) may be reset through the assertion of the gain_ctrl and fd_reset signals in pixel 2. The reset of the floating diffusion node coupled to the readout circuitry of pixel 2 may make the readout circuitry of pixel 2 available to read out charges from the inner PD2 photodiode of another pixel (just as the readout circuitry of pixel 1 was used to read out charges from the inner PD2 photodiode of pixel 2), such as pixel 3.

At step 1530, the readout circuitry of the given pixel may receive and read out charge from an inner photodiode of a second neighboring pixel (in response to the TXL control signal for the second neighboring pixel being asserted). In the example where pixel 2 is the given pixel, the TXL signal in a second neighboring pixel such as pixel 3 (i.e., the TXL_3 signal) may be asserted and result in the charges from the inner PD2 photodiode 682_3 being read transferred to the FD_B3 floating diffusion node, which is coupled to the FD_A2 floating diffusion node and readout circuitry in pixel 2. Because the FD_A2 floating diffusion node was reset in step 1528, after transferring the charges from inner PD1 photodiode 682_3 to the FD_B3 floating diffusion node, asserting the select2 signal provided to the RS2 row select transistor may result in the charges from the inner PD2 photodiode 682_3 in pixel 3 being read out.

At step 1532, the floating diffusion node coupled to the readout circuitry in given pixel may be reset. In the example where pixel 2 is the given pixel, the FD_A2 floating diffusion node that is coupled to the readout circuitry of the SF_2 source follower transistor and the RS2 row select transistor may be reset. This may prepare pixel 2 for another iteration of the method 1520.

Figure 16:
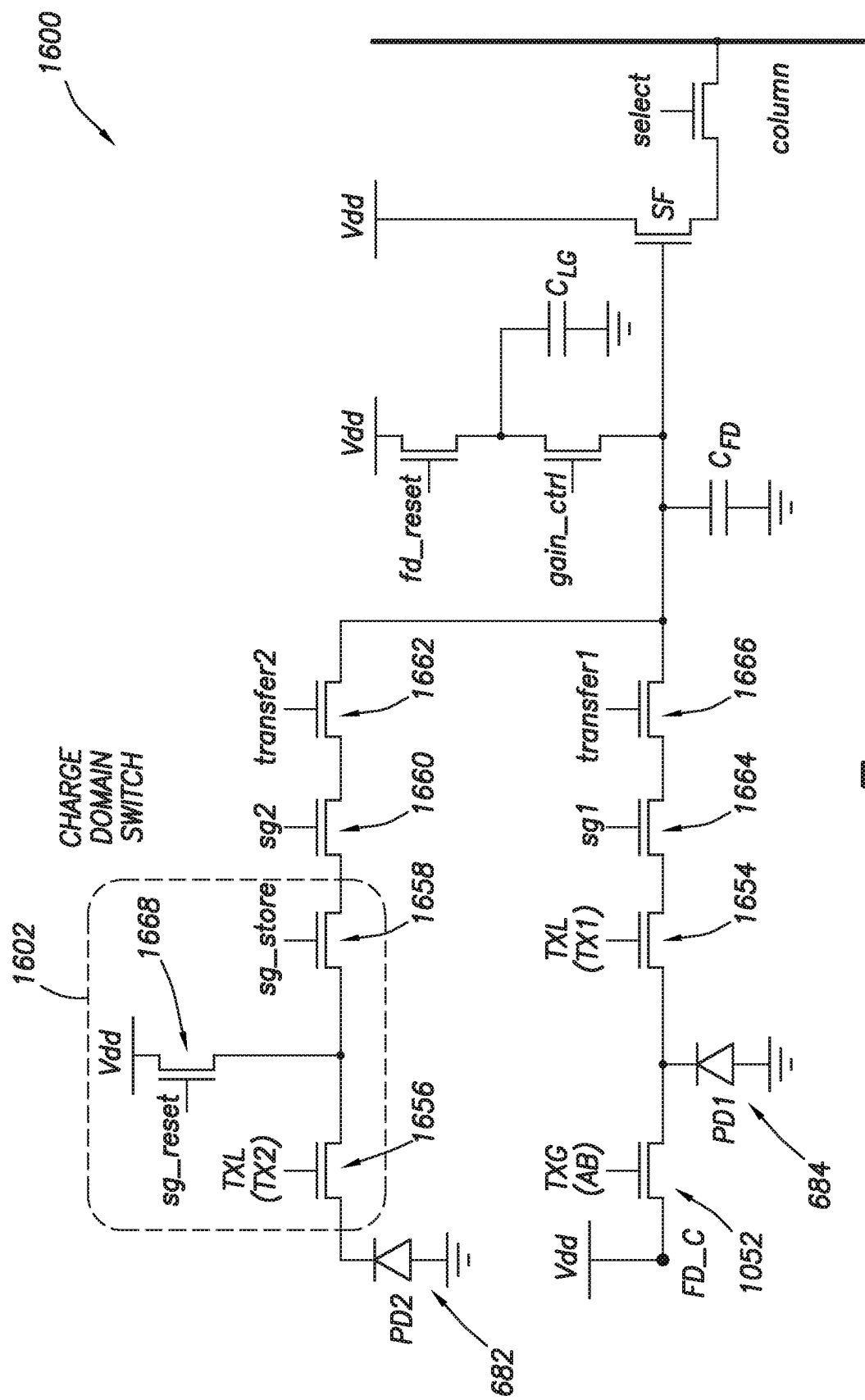
FIG. 16 shows an example of a global shutter pixel circuit for a multiple photodiode image pixel, in accordance with an embodiment.

FIG. 16 shows an example of a global shutter pixel circuit for a multiple photodiode image pixel in accordance with an embodiment. The pixel circuit 1600 may be a global shutter pixel that has internal storage gate structures to store global shutter charges that may be sequentially read out over column lines.

Similar to the pixel circuit shown in earlier figures, the anti-blooming transistor 1652 may be formed from the global vertical transfer gate structure 610-1 that is provided the TXG control signal. The transfer transistors 1654 and 1656 may correspond to the local vertical transfer gate structure 610-2 that is provided the TXL control signal.

When the TXG control signal applied to the global vertical transfer gate 610-1 is asserted, a positive bias may be applied to the vertical transfer gate structure 610-1 and thereby cause charges to be removed from an outer photodiode region 684 (PD1) and transferred to floating diffusion region 624-2 (FD_C) for each pixel. To achieve the circuit topology described in FIG. 16, the floating diffusion region 624-2 (FD_C) for each pixel may be tied to a positive supply voltage Vdd. Charges routed from the outer photodiode 682 (PD1) to the floating diffusion region 624-2 (FD_C) for a given pixel (due to the assertion of the TXG control signal applied to the global vertical transfer gate structure 610-1) will be drained to the power supply Vdd (which is coupled to the FD_C node, in such an embodiment).

The pixel circuit 1600 may include transfer transistors 1654 and 1656 to move charges from the photodiodes 684 and 682 to a respective charge storage nodes. The transfer transistors 1654 and 1656 may represent/model the vertical charge transfer structure 610-2. Asserting the TXL control signal (sometimes referred to as the TX1 control signal in connection with the movement of charges from the PD1 photodiode 684) may cause charges from the PD1 photodiode 682 to be routed to the source-drain terminal of both the storage gate reset transistor 1668 and the storage gate transfer transistor 1658. The combination of the transfer transistor 1656, the storage gate reset transistor 1668, and the storage gate transfer transistor 1658 may be referred to as the charge domain switch 1602. Charges transferred to the source-drain terminal of both the storage gate reset transistor 1668 and the storage gate transfer transistor 1658 upon the assertion of the TXL control signal may be either drained (through the assertion of the sg_reset control signal) or transferred to the storage gate 1660 (through the assertion of the sg_store control signal).

Charges transferred out of the PD2 photodiode using the transfer transistor 1656 may be drained through the reset transistor 1668 to prevent overflow charges in the inner photodiode PD2 from corrupting the signal in the storage gate 1660. The sg_reset control signal provided to the reset transistor 1668 and the sg_store signal provided to the storage gate transfer transistor 1658 may be asserted out-of-phase with each other. In other words, the sg_reset control signal provided to the reset transistor 1668 may be asserted when the sg_store signal provided to the storage gate transfer transistor 1658 is deasserted, and the sg_reset control signal provided to the reset transistor 1668 may be deasserted when the sg_store signal provided to the storage gate transfer transistor 1658 is asserted.

Once charges from the PD1 and PD2 photodiodes have been stored in the storage gates 1664 and 1660, respectively, storage gate readout transistors 1666 and 1662 may be respectively used to transfer the photodiode charges to the floating diffusion node for readout (i.e., the Cfd capacitor coupled to the SF source follower transistor.

The examples above described and shown in connection with FIGS. 2-16 in which each pixel circuit includes at least two vertical transfer gates (a local vertical transfer gate and a global vertical transfer gate) is merely illustrative and does not serve to limit the scope of the present embodiments. If desired, each pixel circuit may include any suitable number of vertical (deep trench) transfer gates having the same or different depths, any number of floating diffusion regions, any number of storage/memory diode regions, and any type of associated pixel readout circuits for operating the pixel in either a rolling shutter configuration or a global shutter configuration. The techniques described above may be implemented on either a backside illumination image sensor or a front-side illumination image sensor.

The foregoing is merely illustrative of the principles of this invention and various modifications can be made by those skilled in the art. The foregoing embodiments may be implemented individually or in any combination.

What is claimed is:
1. An image sensor comprising:
   a semiconductor substrate having first and second opposing surfaces;
   an array of image pixels, wherein the array of image pixels is formed in the semiconductor substrate;
   a trench structure that is coupled to each image pixel of the array of image pixels; and a plurality of local vertical transfer gate structures that are formed within individual image pixels in the array of image pixels, wherein each one of the plurality of local vertical transfer gate structures extends into the semiconductor substrate from the first surface towards the second surface.

2. An image sensor comprising:
an array of image pixels;
a trench structure that is coupled to each image pixel of the array of image pixels; and
a plurality of local vertical transfer gate structures that are formed within individual image pixels in the array of image pixels, wherein the trench structure comprises a global vertical transfer gate structure that selectively transfers charge from a photosensitive region in at least one image pixel of the array of image pixels to a charge storage node.

3. The image sensor of claim 2, wherein the charge storage node is electrically coupled to a positive voltage source, and wherein the global vertical transfer gate structure selectively drains charges from the photosensitive region in the at least one image pixel in response to receiving an asserted control signal.

4. The image sensor of claim 1, wherein a given image pixel of the array of image pixels comprises:
an outer photodiode; and
an inner photodiode that is nested within the outer photodiode.

5. The image sensor of claim 4, wherein a given local vertical transfer gate structure of the plurality of local vertical transfer gate structures is formed between the inner photodiode and the outer photodiode.

6. The image sensor of claim 5, wherein the given local vertical transfer gate structure selectively transfers charges from the outer photodiode to a first floating diffusion node in response to receiving an asserted control signal, and wherein the given local vertical transfer gate structure selectively transfers charges from the inner photodiode to a second floating diffusion node in response to receiving the asserted control signal.

7. The image sensor of claim 6, wherein the given image pixel comprises a first image pixel, wherein a second image pixel of the array of image pixels comprises readout circuitry coupled to the first floating diffusion node, and wherein the first image pixel further comprises:
additional readout circuitry coupled to the second floating diffusion node of the first image pixel.

8. The image sensor of claim 7, wherein the readout circuitry in the second image pixel reads out a first signal based on the charges from the outer photodiode of the first image pixel during a first interval, wherein the additional readout circuitry in the first image pixel reads out a second signal based on the charges from the inner photodiode of the first image pixel during a second interval.

9. The image sensor of claim 7, wherein the readout circuitry in the second image pixel reads out a first signal based on the charges from the inner photodiode of the first image pixel during a first interval, wherein the additional readout circuitry in the first image pixel reads out a second signal based on the charges from the outer photodiode of the first image pixel during a second interval.

10. The image sensor of claim 1, wherein the trench structure comprises a grid-like structure, and wherein the array of image pixels are formed within spaces formed by gaps in the grid-like structure of the trench structure.

11. The image sensor of claim 10, wherein the trench structure comprises a passive isolation structure.

12. The image sensor of claim 1, wherein the image sensor is configured to receive incoming light through the second surface, and wherein the semiconductor substrate comprises:
a residual substrate layer at the second surface;
a photosensitive region formed between the residual substrate layer and the first surface, wherein the trench structure and the plurality of local vertical transfer gate structures extend at least partially into the residual substrate layer.

13. The image sensor of claim 12, wherein a given pixel in the array of image pixels comprises:
an inner photodiode formed in the photosensitive region that is adjacent to a given local vertical transfer gate structure of the plurality of local vertical transfer gate structures;
a first floating diffusion region that is formed in a region between the first surface of the semiconductor substrate and the inner photodiode and that is adjacent to the given local vertical transfer gate structure;
an outer photodiode formed in the photosensitive region that is formed between the given local vertical transfer gate structure and the trench structure;
a second floating diffusion region that is formed in a region between the first surface of the semiconductor substrate and the outer photodiode and that is adjacent to the given local vertical transfer gate structure.

14. The image sensor of claim 13, wherein the trench structure comprises a global vertical transfer gate structure, and wherein the given pixel in the array of image pixels further comprises:
a third floating diffusion region that is formed in a region between the first surface of the semiconductor substrate and the outer photodiode and that is adjacent to the global vertical transfer gate structure.

15. A method of operating an image sensor having an array of image pixels, wherein each image pixel in the array of image pixels has an inner photosensitive region, an outer photosensitive region that surrounds the inner photosensitive region, and readout circuitry, the method comprising:
accumulating charges at the inner and outer photosensitive regions of a given image pixel of the array of image pixels;
while accumulating the charges at the outer photosensitive region, using a global vertical transfer gate structure that is coupled to the outer photosensitive region to drain excess accumulated charges from the outer photosensitive region;
using a local vertical transfer gate, transferring the accumulated charges from the inner photosensitive region to a first charge storage region while simultaneously transferring the accumulated charges from the outer photosensitive region to a second charge storage region;
reading out the charges transferred to the first charge storage region using the readout circuitry in the given image pixel; and
reading out the charges transferred to the second charge storage region.

16. The method of claim 15, wherein reading out the charges transferred to the second charge storage region comprises:
using the readout circuitry in another image pixel in the array of image pixels to read out the charges transferred to the second charge storage region in the given image pixel.

17. The method of claim 15, wherein the first charge storage region comprises a first storage gate structure, wherein the second charge storage region comprises a second storage gate structure, wherein the charges transferred to the first charge storage region and the charges transferred to the second charge storage region are read out using the readout circuitry in the given image pixel during a separate respective intervals, and wherein the method further comprises:

while accumulating charges at the inner photosensitive region, using a charge domain switch to selectively drain excess accumulated charges from the inner photosensitive region.

18. The image sensor of claim 1, wherein the trench structure is a global vertical transfer gate structure with a grid-like pattern, wherein the image pixels are formed in spaces between the grid-like pattern of the global vertical transfer gate structure, and wherein each image pixel in the array of image pixels comprises:

an inner photodiode;

an outer photodiode, wherein the inner photodiode is laterally surrounded by the outer photodiode and wherein each local vertical transfer gate structure is formed between the inner photodiode and the outer photodiode;

a first charge storage region that is coupled to the inner photodiode through the local vertical transfer gate structure;

a second charge storage region that is coupled to the outer photodiode through the local vertical transfer gate structure; and a third charge storage region that is coupled to the outer photodiode through the global vertical transfer gate structure.

* * * * *